United States Patent
Takahashi

Patent Number: 5,311,136
Date of Patent: May 10, 1994

[54] GRADIENT POWER SOURCE APPARATUS FOR MAGNETIC RESONANCE IMAGING SYSTEM

[75] Inventor: Fumikazu Takahashi, Tochigi, Japan

[73] Assignee: Kabushiki Kaisha Toshiba, Kawasaki, Japan

[21] Appl. No.: 981,597

[22] Filed: Nov. 25, 1992

[30] Foreign Application Priority Data

Nov. 28, 1991 [JP] Japan .................................. 3-314833

[51] Int. Cl.⁵ .............................................. G01V 3/00
[52] U.S. Cl. .................................... 324/322; 324/318
[58] Field of Search ............... 324/322, 318, 313, 314, 324/300

[56] References Cited

U.S. PATENT DOCUMENTS

| | | | |
|---|---|---|---|
| 4,437,053 | 3/1984 | Bax | 324/322 |
| 4,628,264 | 12/1986 | Rzedzian | 324/318 |
| 4,703,275 | 10/1987 | Holland | 324/318 |
| 4,820,986 | 4/1989 | Mansfield et al. | 324/322 |
| 4,961,054 | 10/1990 | Park et al. | 324/322 |
| 5,063,349 | 11/1991 | Roemer et al. | 324/322 |

Primary Examiner—Louis Arana
Attorney, Agent, or Firm—Limbach & Limbach

[57] ABSTRACT

A capacitor is connected in parallel with a gradient coil to form a parallel resonance circuit with the gradient coil. A gradient coil current is reversed utilizing parallel resonance of the gradient coil and the capacitor. The gradient coil current is detected by a shunt resistor connected in series to a power source. A voltage across the shunt resistor is compared with a reference voltage to control a power-source voltage, thereby controlling a gradient-coil current waveform. This arrangement allows imaging sequences to be performed in a short time without involving gradient field waveform distortion and increasing power consumption. A gradient power source apparatus suited for ultra high-speed MRI apparatus is provided.

18 Claims, 23 Drawing Sheets

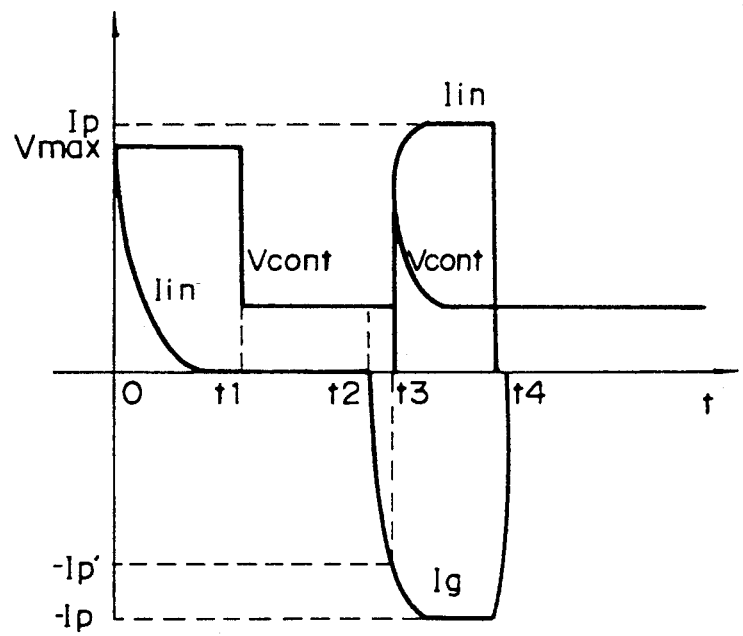
F I G. 10
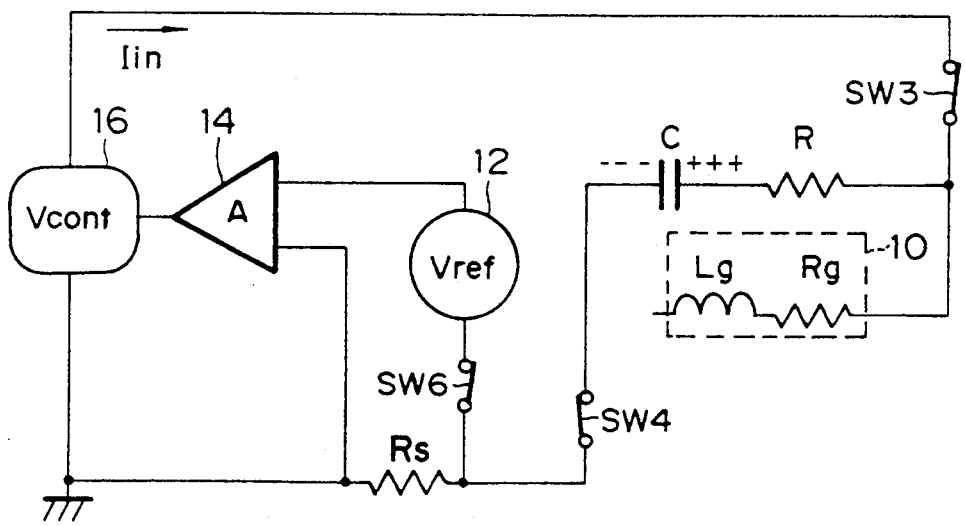
F I G. 11

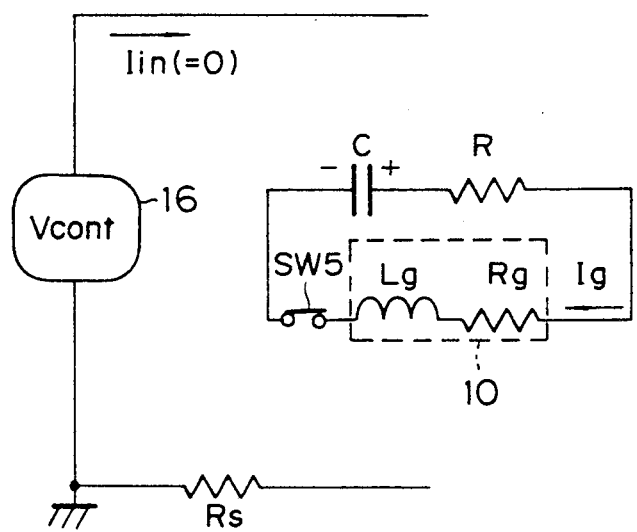
F I G. 12
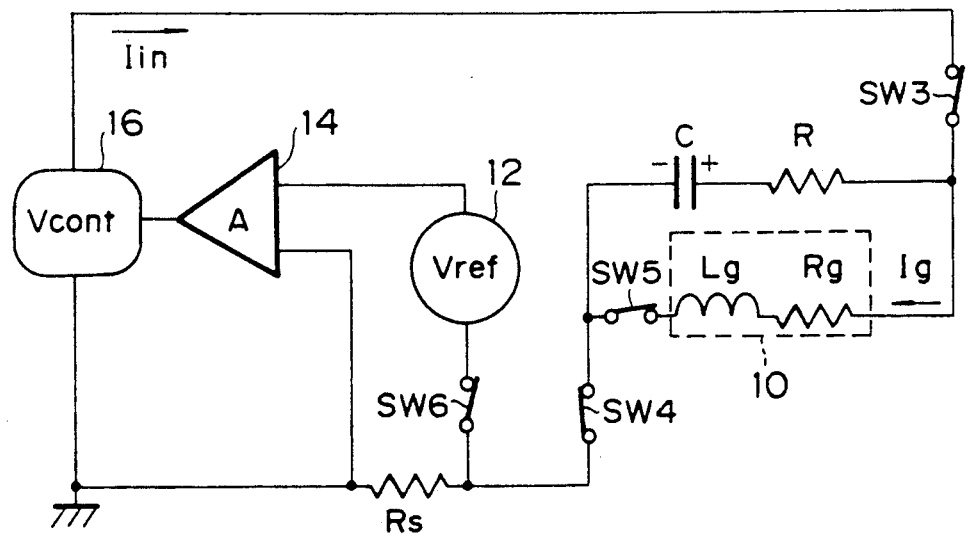
F I G. 13

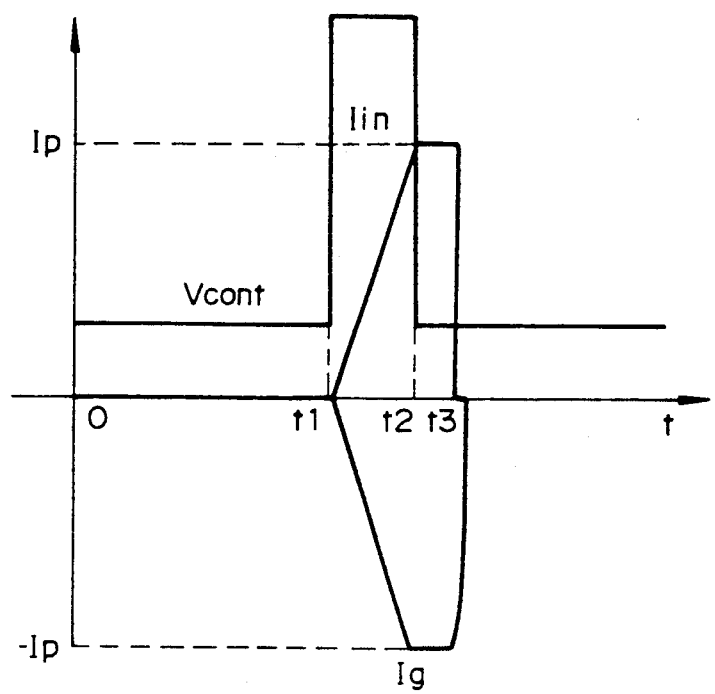
F I G. 14
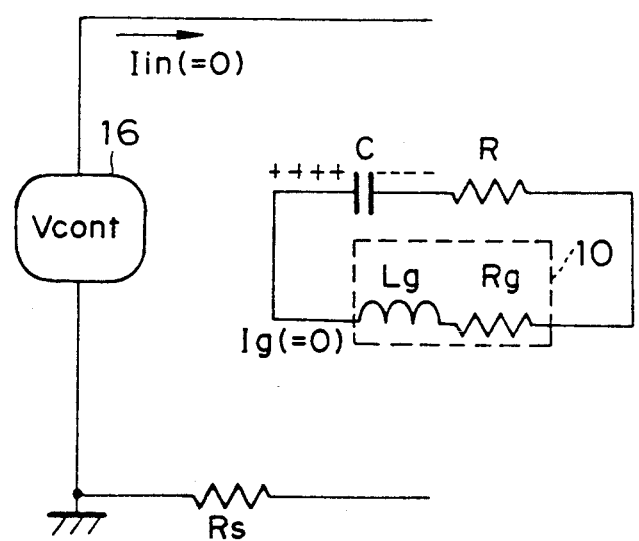
F I G. 15

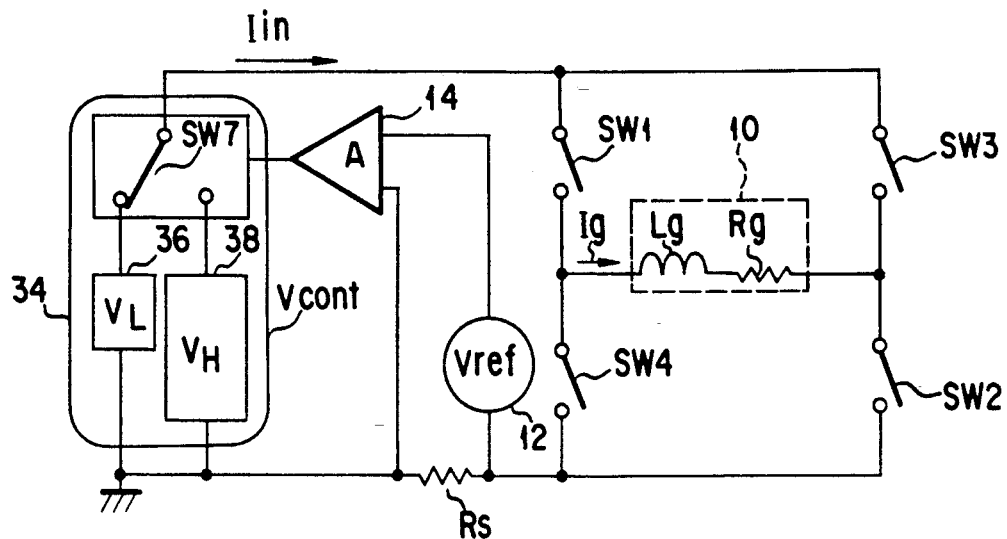
F I G. 27
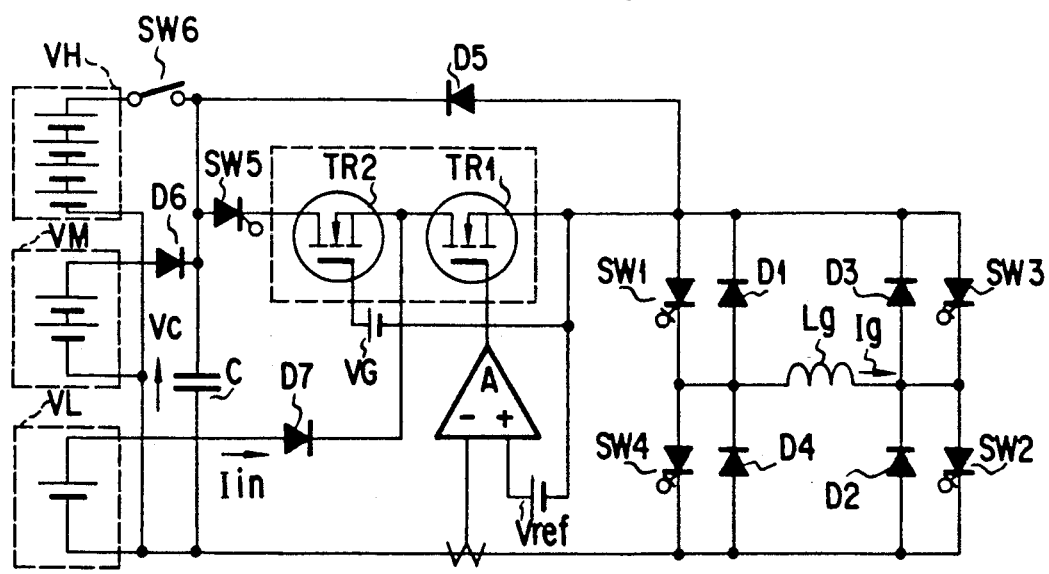
F I G. 28

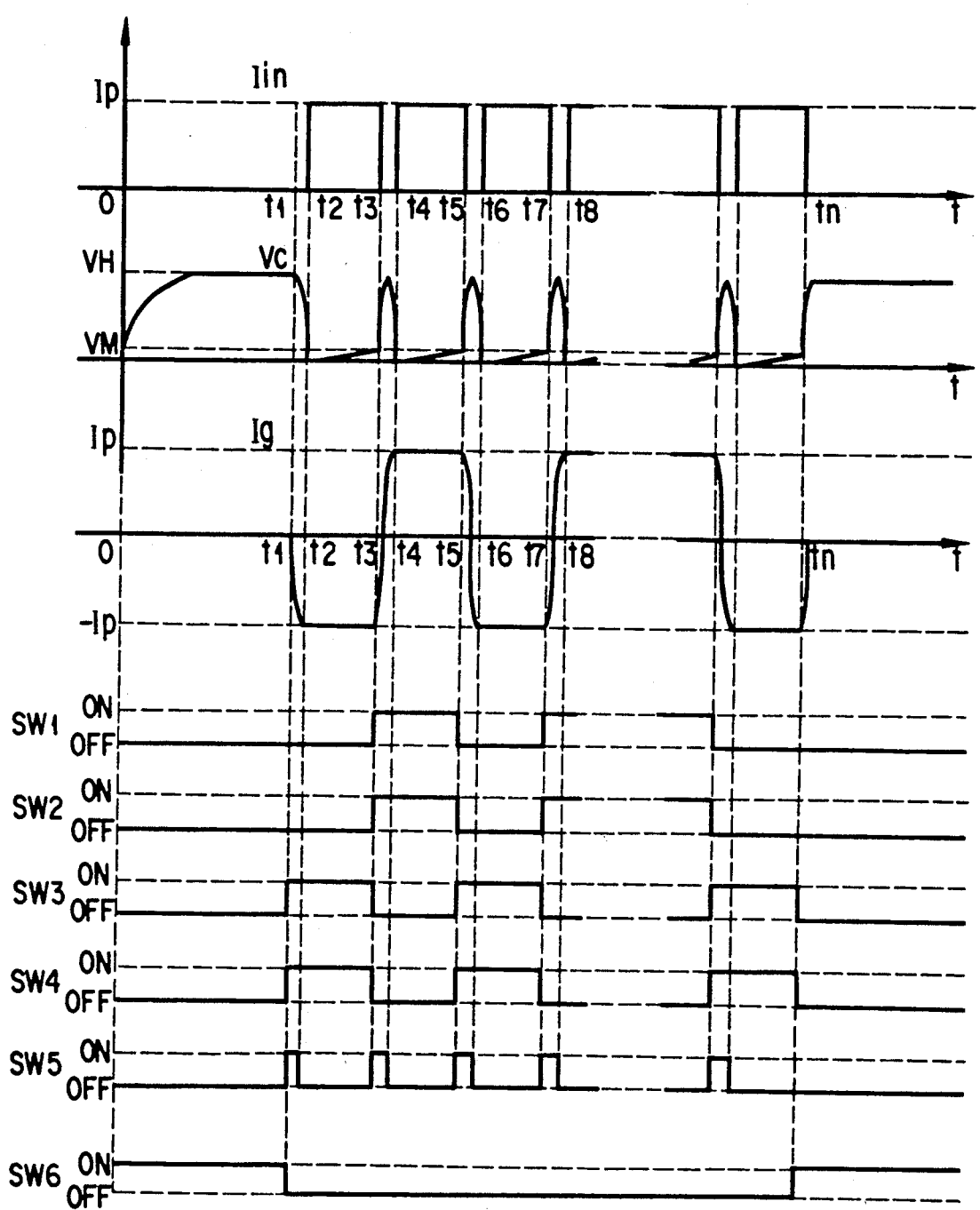
F I G. 29

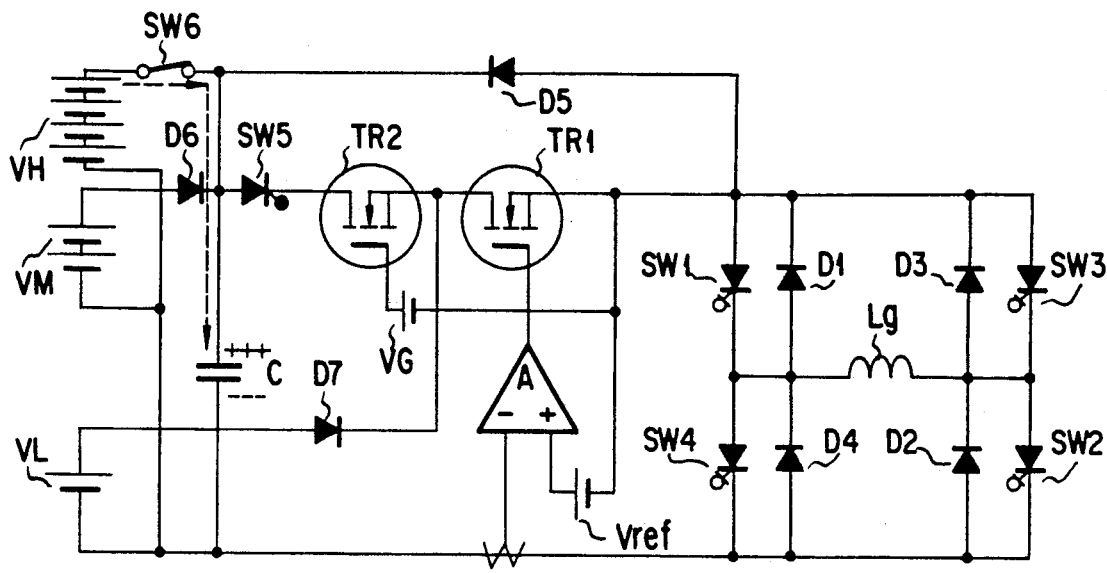
F I G. 30
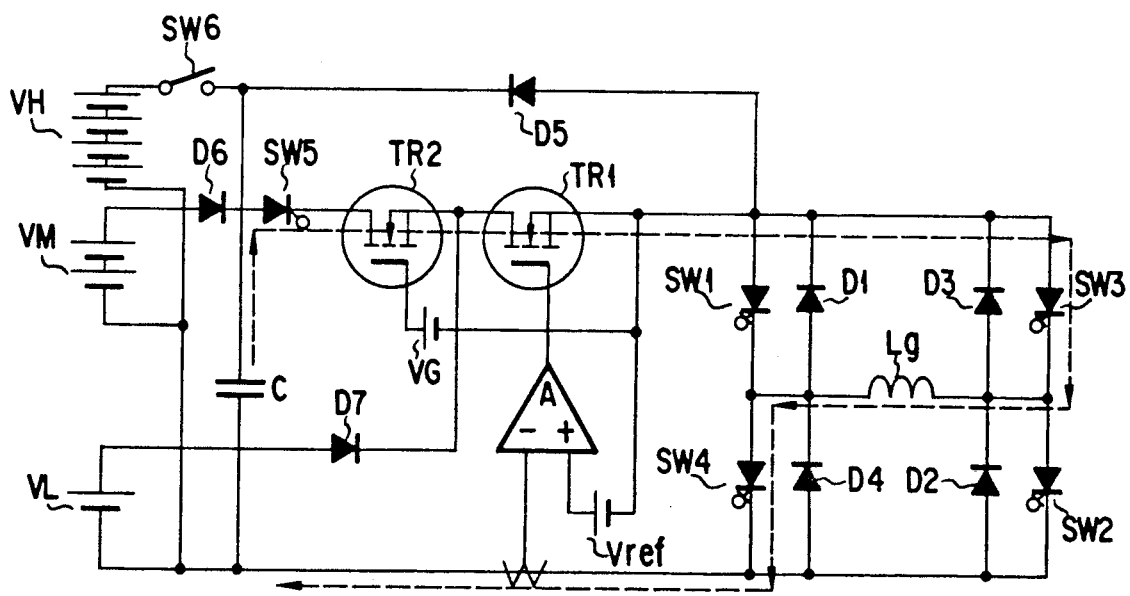
F I G. 31

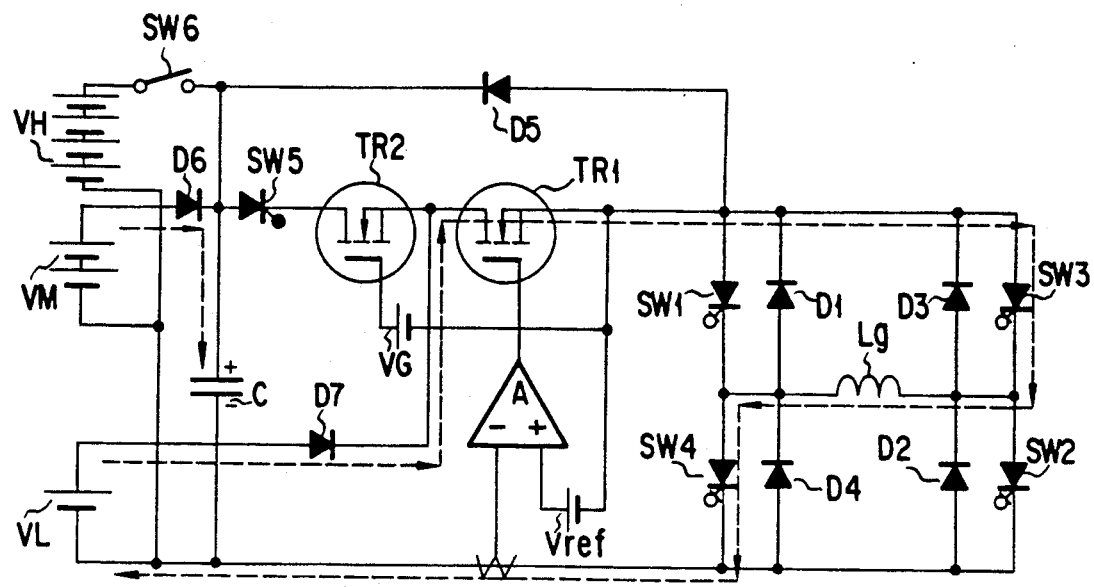
F I G. 32
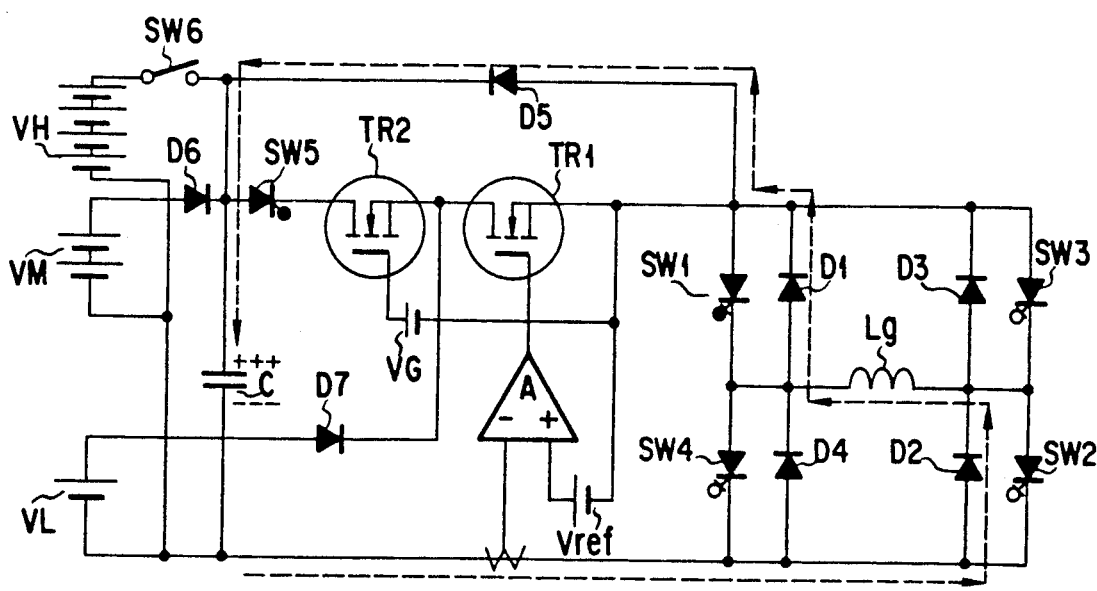
F I G. 33

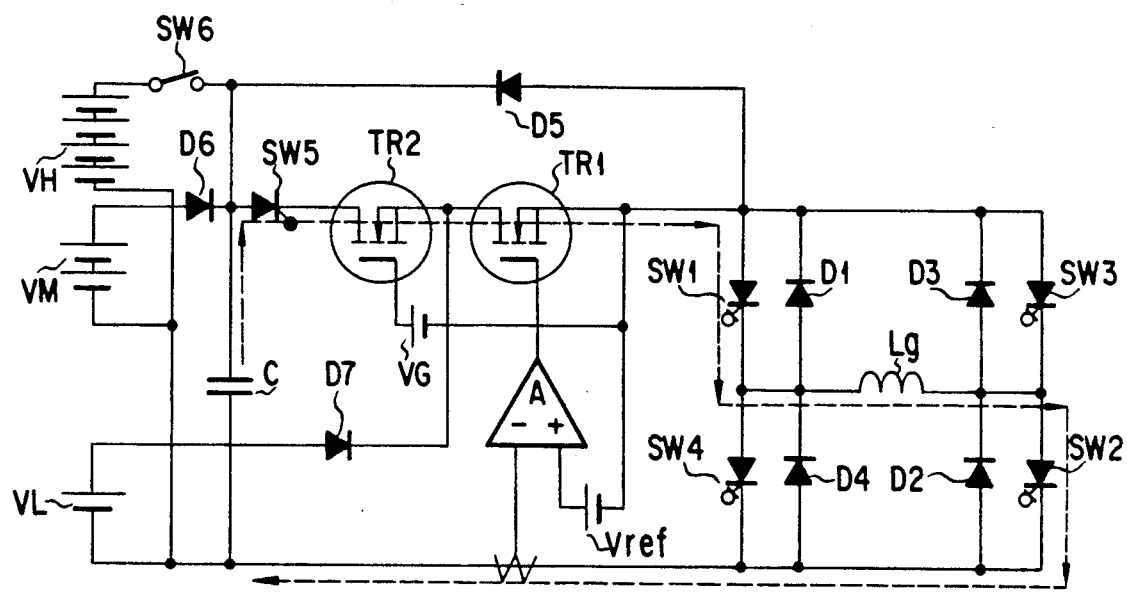
F I G. 34

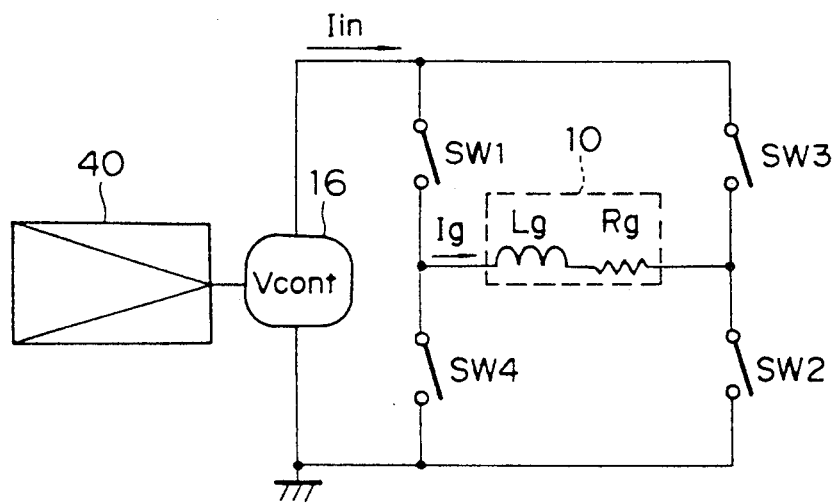
F I G. 35
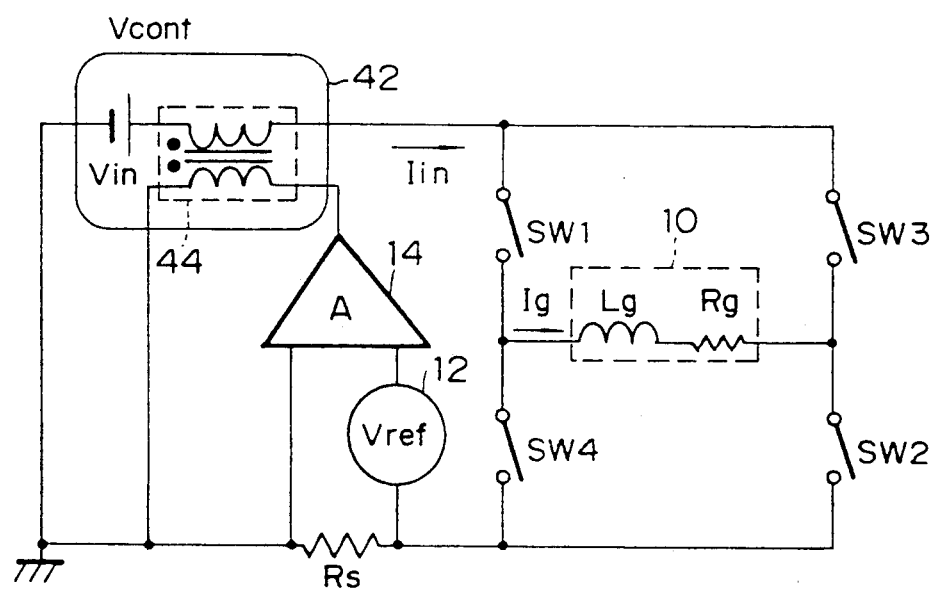
F I G. 36

GRADIENT POWER SOURCE APPARATUS FOR MAGNETIC RESONANCE IMAGING SYSTEM

BACKGROUND OF THE INVENTION

1. Field of the Invention

The present invention relates to gradient power source apparatus for use in magnetic resonance imaging (MRI) apparatus which supplies a gradient coil with a current having a desired waveform to thereby cause the gradient coil to produce a gradient magnetic field with a desired waveform.

2. Description of the Related Art

As one of magnetic resonance imaging techniques an echo-planar technique which permits ultra high-speed scan has been developed in recent years. The echo-planar technique will replace the conventional spin-echo technique. With such an ultra high-speed imaging technique, such a pulse sequence as shown in FIG. 1 is used. In this pulse sequence, a readout gradient field Gr is several times as strong as that used in the spin-echo technique. An ultra high-speed MRI apparatus requires a high current of the order of 500 to 600 amperes to flow through a gradient coil having considerably high inductance. Moreover the high current needs to be switched between positive and negative polarities at a high speed.

As a prior art of a gradient power source apparatus for carrying out an ultra-high-speed-scan pulse sequence there is known a "gradient current speed-up circuit for high-speed NMR imaging system" which is disclosed U.S. Pat. No. 4,961,054. This is a kind of inverter, and its basic arrangement is illustrated in FIG. 2. A gradient coil 2 represented by a series combination of inductance Lg and resistance Rg has an end connected in common to ends of switching devices SW1 and SW4 and the other end connected in common to ends of switching devices SW2 and SW3. The other ends of the switching devices SW1 and SW3 are connected together to the positive terminal of a constant-voltage source 6 through a choke coil 4 represented by a series combination of inductance Lc and resistance Rc. The other ends of the switching devices SW2 and SW4 are connected together to the negative terminal (ground terminal) of the voltage source 6. That is, the switching devices SW1 to SW4 construct a bridge circuit. As the switching devices SW1 to SW4, transistors, thyristors, gate turn-off thyristors (GTO) or the like can be used. The switching devices SW1 to SW4 are subjected to on/off control by control signals from a sequence controller (not shown) incorporated into MRI apparatus, thereby carrying out such a pulse sequence as shown in FIG. 1. Snubber circuits S used for protection are connected in parallel with the respective switching devices SW1 to SW4.

The operation of the gradient power source apparatus shown in FIG. 2 for producing, for example, the readout gradient magnetic field Gr shown in FIG. 1 will be described with reference to FIG. 3, which is a timing diagram illustrating on and off times of the switching devices SW1 to SW4, and waveforms of a source voltage Vin, a source current Iin, and a gradient coil current Ig.

At time t=0, the switching devices SW1 and SW4 are turned on and then the apparatus waits for the source current Iin to reach a predetermined value Ip (t=t1). At time t=t1, the switching devices SW3 and SW4 are turned on, and the switching devices SW1 and SW2 are turned off, so that a current Ig flows through the gradient coil 2. At time t=t2, the switching devices SW1 and SW2 are turned on, and the switching devices SW3 and SW4 are turned off, so that the direction of current flow through the gradient coil 2 is reversed. Repeating the on/off switching of the switching devices SW1 to SW4 in accordance with the timing diagram of FIG. 3 permits a rectangular-wave current Ig having such a flat top as the readout gradient field Gr shown in FIG. 1 has to flow through the gradient coil 2.

Since the inductance Lg of the gradient coil 2 is considerably high, however, the waveform of the coil current Ig may be so degraded that its flat top cannot be kept. In order to avoid the waveform degradation of the gradient coil current Ig, the choke coil 4 is connected between the power source 6 and the bridge-connected switching devices. The choke coil 4 has inductance Lc which is five to twenty times higher than the inductance Lg of the gradient coil 2, thus permitting the source current Iin to be kept substantially constant.

With such an arrangement, however, the connection of the choke coil 4 having high inductance Lc (usually 5 to 20 millihenries) requires to wait until the source current Iin reaches a predetermined current value Ip at t=1 from when the power is turned on at t=0. During the interval t=0 to t=t1, magnetic resonance imaging cannot be performed. That is, a waiting time of t1 is required from when the power is turned on until data acquisition is started, which offsets an advantage of ultra high-speed MRI apparatus that a large number of imaging scans can be accomplished within a short period of time. If, on the other hand, current were continued to flow between imaging scans so as to eliminate the waiting time, power consumption would increase because of a high current on the order of 500 to 600 amperes.

Moreover, the choke coil, which has high inductance and permits a high current flow, is very great in size and weight.

Furthermore, keeping the source current Iin substantially constant requires to store high magnetic energy in the choke coil 4, which increases power consumption. The magnetic energy Wc (in joules) is represented by $$Wc = (\tfrac{1}{2}) Lc Ip^2 \qquad (1)$$

where Lc is the inductance of the choke coil 4, and Ip is a current flowing through the choke coil 4 which equals a maximum value of the gradient coil current Ig.

Equation (1) shows that the higher the choke coil inductance Lc becomes, the higher the magnetic energy Wc to be stored becomes, and thus power consumption increases.

If the choke coil inductance Lc were decreased so as to shorten the waiting time and reduce the power consumption, the waveform of the gradient coil current Ig would deteriorate. Non-rectangular coil current waveforms would degrade MRI image quality.

It is required to keep a peak value of the gradient coil current substantially constant. When the switching is made at regular intervals as shown in FIG. 3, the peak value can be kept constant. If, however, the switching were made at irregular intervals to regulate echo acquisition times, the peak value could not be kept constant because of decay due to loss in the snubber circuits.

Another prior art, as shown in FIG. 4, adds capacitors C1 and C2 and diodes D1 to D4 to the arrangement of FIG. 2 for the purpose of regulating a reversing time (from t3 to t4 in FIG. 5) of the gradient coil current. FIG. 5 is a timing diagram illustrating the operation of this prior art.

However, a problem with the prior art is that the waveform of the gradient coil current Ig shown in FIG. 5 will be distorted by charging and discharging of the capacitors C1 and C2. This problem will be solved by further increasing the inductance of the choke coil 4. However, this not only increases the power consumption and lengthens the waiting time as described above but also makes the choke coil itself large.

Still another solution is to connect a resistor in parallel or series with each of the capacitors C1 and C2, thereby consuming extra energy. However, a problem arises in that power consumption increases.

As shown in FIG. 6A, even if a rectangular current is caused to flow through the gradient coil 2 to thereby produce a rectangularly pulsed gradient field, the waveform of a composite magnetic field, within a static-magnetic-field forming superconducting magnet, of the gradient field and a magnetic field component due to an eddy current generated in a metal cylinder of the superconducting magnet may be non-rectangular. Heretofore, in order to compensate for such waveform distortion, an eddy current compensating component is superimposed upon the gradient coil current as shown in FIG. 6B so that a composite magnetic field can have a rectangular waveform. However, a current type inverter will not generate a current having such a waveform as shown in FIG. 6B, failing to compensate for waveform distortion due to eddy current.

SUMMARY OF THE INVENTION

It is accordingly an object of the present invention to provide a gradient power source apparatus which is suited for ultra high-speed MRI apparatus and permits imaging sequences to be performed in a short time without involving waveform distortion and increasing power consumption.

According to a first aspect of the present invention there is provided a gradient power source apparatus comprising a capacitor connected in parallel with a gradient coil to form a resonance circuit, a plurality of bridge-connected switching devices connected between a power source terminal and the gradient coil, and means for controlling the switching devices to bring the resonance circuit to resonance, reverse a current flowing through the gradient coil, and control the waveform of the current.

According to a second aspect of the present invention there is provided a gradient power source apparatus comprising detecting means for detecting a current flowing through a gradient coil, and means responsive to the result of detection by the detecting means for controlling a power source so as to supply a current with a desired waveform to the gradient coil.

According to the gradient power source apparatus of the first aspect of the present invention, by causing a resonance current to flow through the gradient coil, a waiting time from when the power source is put to work to the time when a coil current reaches a predetermined level and hence an imaging sequence can be initiated and power consumed during that time can be reduced because a choke coil can be removed or its inductance can be made small without causing deterioration of the waveform of a rectangular current. In addition, in reversing the coil current, energy of the resonance circuit can be used to reduce power consumption.

According to the gradient power source apparatus of the second aspect of the present invention, monitoring the coil current waveform for feedback control of the power source permits deterioration of the waveform of the gradient coil current to be avoided.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 10 is a diagram illustrating a first method of rising the gradient coil current in the embodiment of FIG. 7;

FIG. 11 illustrates a current flow in the embodiment of FIG. 7 at time t=t1 in the timing diagram of FIG. 9;

FIG. 12 illustrates a current flow in the embodiment of FIG. 7 at time t=t2 in the timing diagram of FIG. 9;

FIG. 13 illustrates a current flow in the embodiment of FIG. 7 at time t=t3 in the timing diagram of FIG. 9;

FIG. 14 is a diagram illustrating a second method of rising the gradient coil current in the embodiment of FIG. 7;

FIG. 15 illustrates a current flow at a time of resonance in the embodiment of FIG. 7;

FIG. 27 is a schematic illustration of a gradient power source apparatus according to a fifth embodiment of the present invention;

FIG. 28 is a schematic illustration of a gradient power source apparatus according to a sixth embodiment of the present invention;

FIG. 29 is a timing diagram for use in explanation of the operation of the sixth embodiment of FIG. 28;

FIG. 30 illustrates a current flow in the sixth embodiment of FIG. 28 at time t=0 in the timing diagram of FIG. 29;

FIG. 31 illustrates a current flow in the sixth embodiment of FIG. 28 at time t=t1 in the timing diagram of FIG. 29;

FIG. 32 illustrates a current flow in the sixth embodiment of FIG. 28 at time t=t2 in the timing diagram of FIG. 29;

FIG. 33 illustrates a current flow in the sixth embodiment of FIG. 28 at time t=t3 in the timing diagram of FIG. 29;

FIG. 34 illustrates a current flow in the sixth embodiment of FIG. 28 at time t=t4 in the timing diagram of FIG. 29;

FIG. 35 is a schematic illustration of a gradient power source apparatus according to a seventh embodiment of the present invention; and FIG. 36 is a schematic illustration of a gradient power source apparatus according to an eighth embodiment of the present invention.

DETAILED DESCRIPTION OF THE PREFERRED EMBODIMENTS

Figure 7:
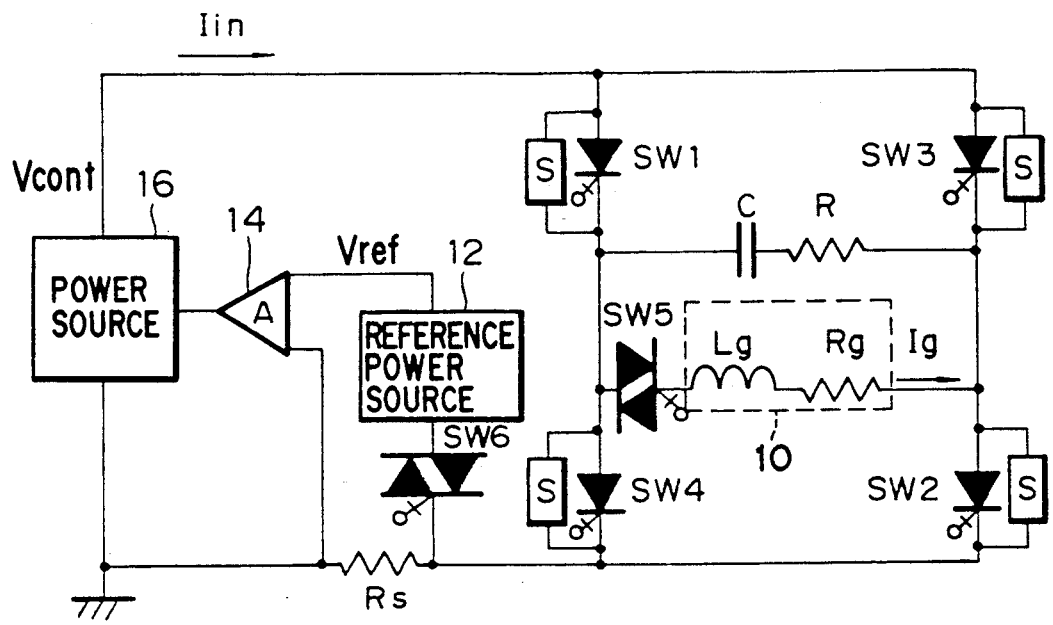
FIG. 7 is a schematic illustration of a gradient power source apparatus according to a first embodiment of the present invention.

A preferred embodiment of a gradient power source apparatus according to the present invention will now be described with reference to the accompanying drawings. FIG. 7 illustrates a gradient power source according to a first embodiment of the present invention. A gradient coil 10 having inductance Lg and resistance Rg, which are equivalently shown in the form of a series combination, is connected in series with a switching device SW5. An actual MRI apparatus needs three types of gradient magnetic fields; a readout gradient magnetic field Gr, a slice-selection gradient magnetic field Gs, and a phase-encoding gradient magnetic field Ge. Thus, a gradient coil is provided for a respective gradient field, and a gradient power source apparatus is also connected to its corresponding respective gradient coil. A series combination of a capacitor C and a resistor R is connected in parallel with the series combination of the gradient coil 10 and the switching device SW5, whereby a parallel resonance circuit is formed.

The series combination of the gradient coil 10 and the switching device SW5 has its end connected together to ends of switching devices SW1 and SW4 and its other end connected together to ends of switching devices SW3 and SW2. The other ends of the switching devices SW1 and SW3 are connected together to the positive terminal of a power source 16, which is responsive to a regulation signal from a differential amplifier 14 which will be described later to vary its output voltage Vcont. The other ends of the switching devices SW2 and SW4 are connected together to a ground terminal (the negative terminal of the power source 16) through a resistor Rs. That is, the switching devices SW1 to SW4 construct a bridge circuit. As the switching devices SW1 to SW4 use may be made of power transistors, power MOSFETs, insulated gate bipolar transistors (IGBTs), static induction transistors (SITs), gate turnoff devices (GTOs) or the like. For example, GTOs are used herein.

Figure 8:
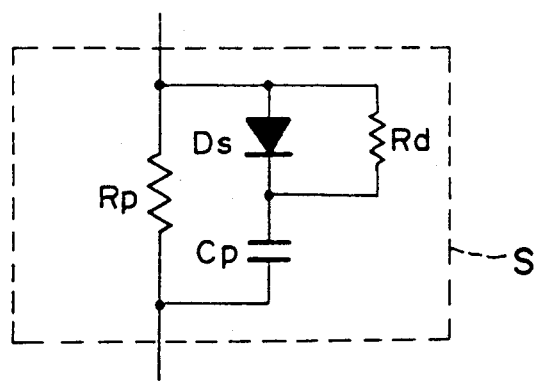
FIG. 8 is a circuit diagram of a snubber circuit connected to each of switching devices of FIG. 7.

In order to protect the switching devices, a snubber circuit S arranged as shown in FIG. 8 is connected in parallel with each of the switching devices SW1 to SW4. In the snubber circuit S, a series combination of a diode Ds and a capacitor Cp is connected in parallel with a resistor Rp, and a resistor Rd is connected in parallel with the diode Ds. The snubber circuit needs not necessarily to be connected and moreover its arrangement is not limited to that shown in FIG. 8.

A current flowing through the gradient coil 10 is sensed by the shunt resistor Rs, and a voltage across the resistor Rs and an output voltage Vref of a reference voltage source 12 are applied to the differential amplifier 14. An output voltage of the differential amplifier 14, corresponding to the difference between the input voltages thereto, is fed back to the power source 16 as a regulating voltage. That is, the resistor Rs, the reference voltage source 12, and the differential amplifier 14 construct a feedback circuit which monitors the gradient coil current to compensate for waveform distortion. A switching device SW6 is connected between the resistor Rs and the reference voltage source 12. As the switching devices SW5 and SW6 use may be made of transistors, thyristors, GTOs or the like. For example, reverse-paralleled GTOs are used herein. The power source 16 produces a voltage Vcont corresponding to the regulating voltage applied thereto and outputs a power source current Iin. For this reason, when a rectangular current with a magnitude of Ip is caused to flow through the gradient coil 10, the reference voltage Vref is set at a DC voltage Rs·Ip.

Figure 1:
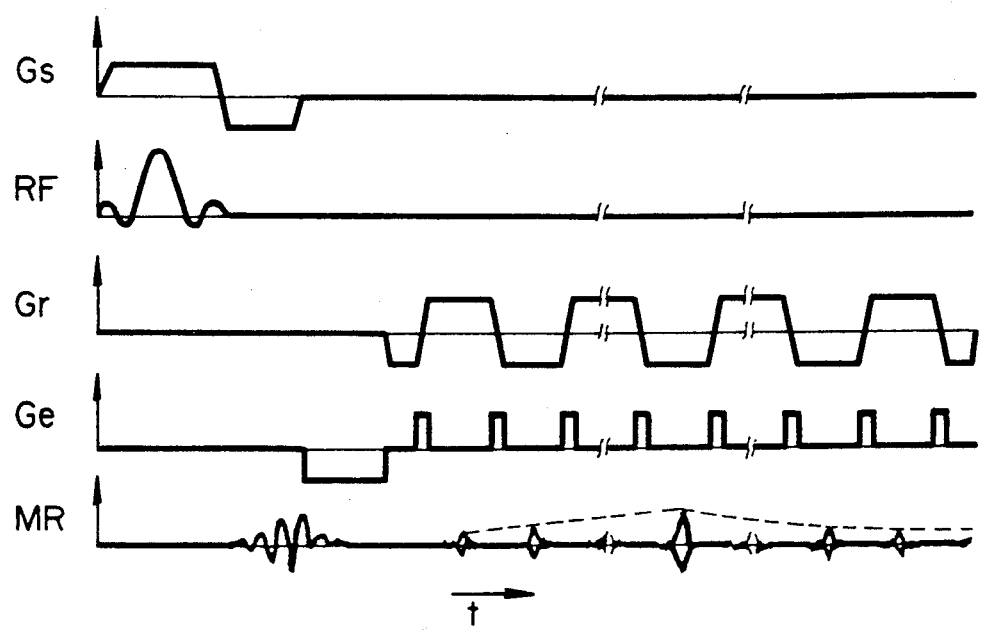
FIG. 1 illustrates a typical pulse sequence for the echo-planar method.

Control signals are applied from a sequence controller (not shown) in the MRI apparatus to control terminals of the switching devices SW1 to SW6, so that they are subjected to on/off control. A combination of on and off of the switching devices controls a waveform of the gradient coil current Ig, thereby permitting a gradient field according to a predetermined pulse sequence to be produced. The sequence controller stores such an echo-planar pulse sequence as shown in FIG. 1 by way of example.

The operation of the gradient power source apparatus of the first embodiment arranged as described above will be described with reference to FIG. 9, which is a timing diagram in which on/off times of the switching devices SW1 to SW6 and waveforms of the power source current Iin, the power source voltage Vcont, and the gradient coil current Ig are illustrated.

Figure 9:
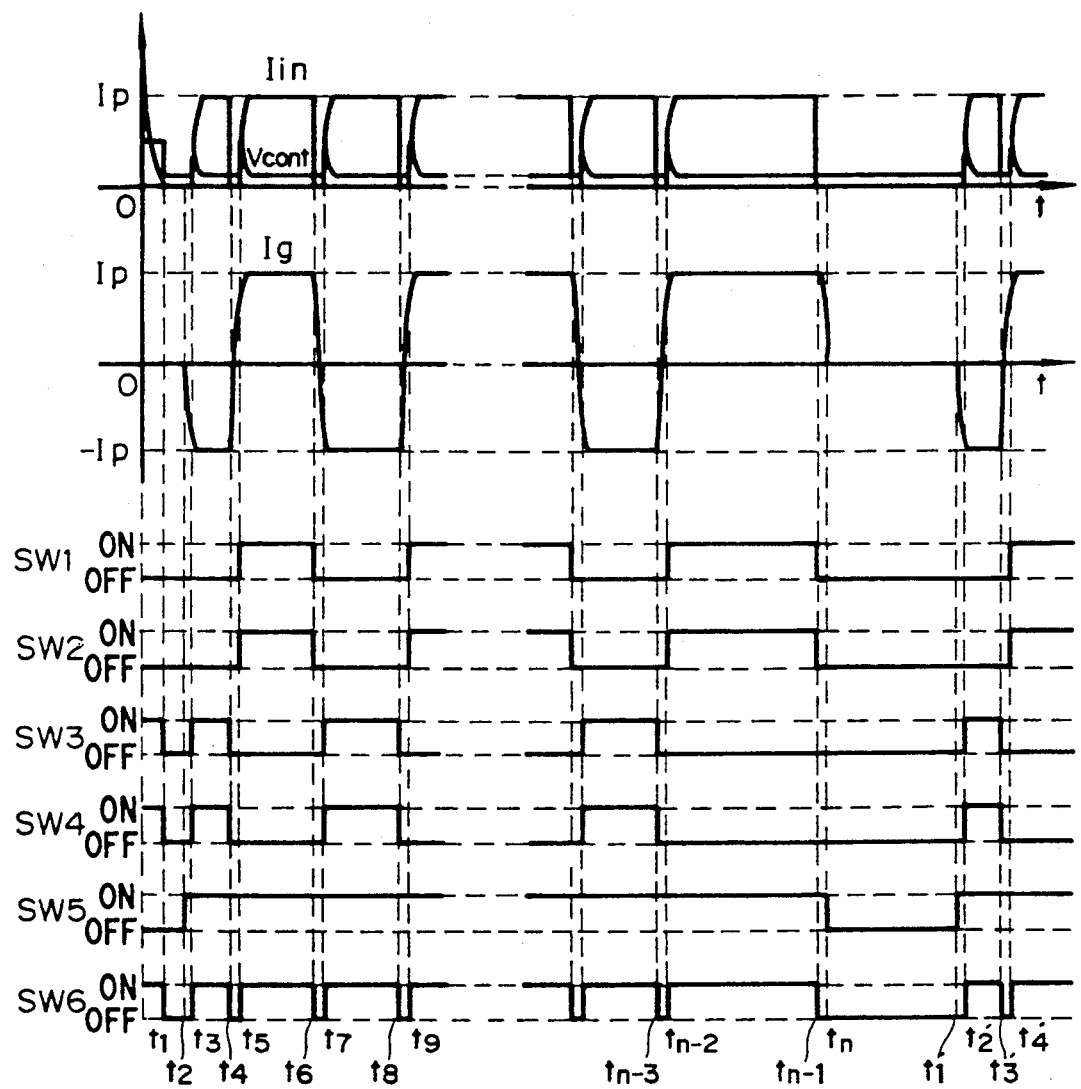
FIG. 9 is a timing diagram for use in explanation of the operation of the first embodiment of FIG. 7.

There are two methods of raising the coil current Ig from the initial state to a desired value Ip. FIG. 9 illustrates a first one of the methods. It is to be noted here that during the first rectangular waveform interval of the readout gradient field Gr in FIG. 1, i.e., during the interval from t2 to t4 in FIG. 9, no MR signals are read out. Thus, the area of a portion enclosed with the time axis and the current waveform over the interval from t2 to t4 has only to be half that over the interval from t5 to t6. The current waveform in the interval from t2 to t4 needs not necessarily to be rectangular.

The first raising method will be described with reference to FIG. 10, in which the waveforms of the power source voltage Vcont and the power source current Iin in the interval from t=0 to t=t4 in FIG. 9 are illustrated enlarged. First, the power source 16 is put to work at t=0 and only the switching devices SW3, SW4, and SW6 are turned on during the interval from t=0 to t=t1, so that the capacitor C is charged by the power source voltage Vcont. The connected state of the circuit and the current flow at a point of time (t=t1) are illustrated in FIG. 11.

Next, when only the switching device SW5 is turned on at an arbitrary time that imaging is started, for example, at t=t2, a current Ig flows from the capacitor C to the gradient coil 10 because of parallel resonance of the gradient coil 10 and the CR series combination. The connected state of the circuit and the current flow at t=t2 are illustrated in FIG. 12. The power source current Iin is 0.

At t=t3 that the charge on the capacitor C is minimum, the gradient coil current Ig reaches its peak value. When the peak value does not reach −Ip, the switching devices SW3, SW4, and SW6 are turned on to generate an overshoot voltage from the power source 16, thereby raising the gradient coil current Ig up to −Ip. The connected state of the circuit and the current flow at t=t3 are illustrated in FIG. 13. The amount of charge stored on the capacitor C is adjusted previously during the interval from t=0 to t=t1 so that the gradient coil current Ig can be raised up to −Ip during the interval from t=t3 to t=t4.

Next, a second raising method will be described below. This method will be used with a power source for use at high voltage and high current. That is, as shown in FIG. 14, when the switching devices SW3, SW4, SW5, and SW6 are turned on at t=t1, the gradient coil current Ig is raised straight up to −Ip owing to a high voltage Vcont from the power source 16.

Those two raising methods can be used properly according to the performance of the power source 16.

Next, the MR echo signal reading operation will be described. In order to read out MR echo signals, the current waveforms after time t=t5 in FIG. 9 need to be rectangular.

As shown in FIG. 13, an electric charge corresponding to a voltage across the gradient coil 10 have been stored on the capacitor C by time t=t4. When, in this state, the switching devices SW1 to SW4 are turned off at t=t4, the parallel resonance circuit including the gradient coil 10 and the capacitor C is formed. During the interval from t4 to t5 when resonance occurs, if the switching device SW6 is turned off so that the feedback circuit (the reference voltage source 12 and the differential amplifier 14) is turned off and the power source current Iin is zero, power consumption can be reduced. The connected state of the circuit and the current flow state at resonance (during the interval from t4 to t5) are the same as those shown in FIG. 12. When resonance occurs, the current flowing through the gradient coil 10 flows into the capacitor C, so that electric charge is stored on the capacitor C. When a resonance current flowing through the gradient coil 10 becomes zero, the electric charge on the capacitor C becomes maximum, so that the magnetic energy of the gradient coil 10 is stored on the capacitor C as electrostatic energy. The connected state of the circuit and the current flow state at resonance are illustrated in FIG. 15.

Figure 16:
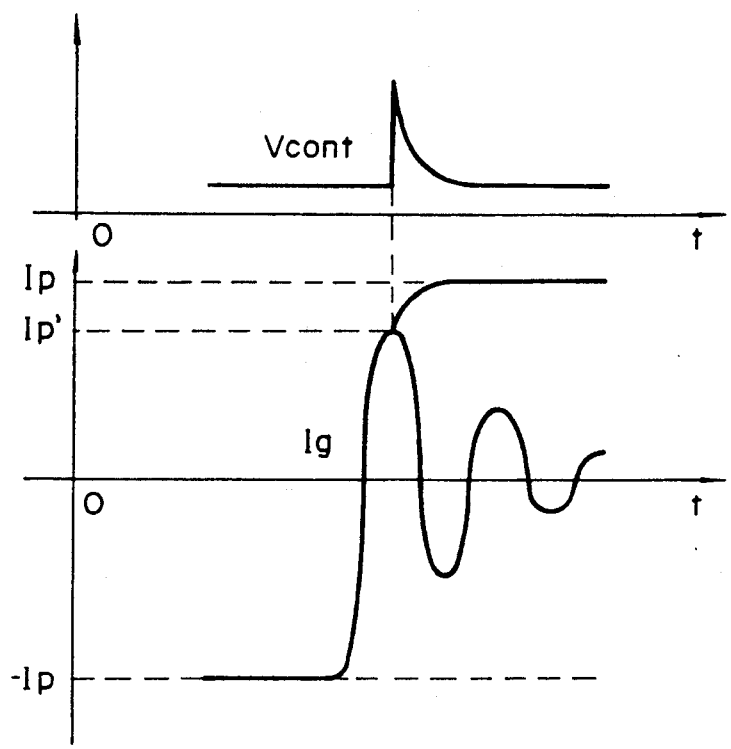
FIG. 16 illustrates damped oscillation of a resonance current.
Figure 17:
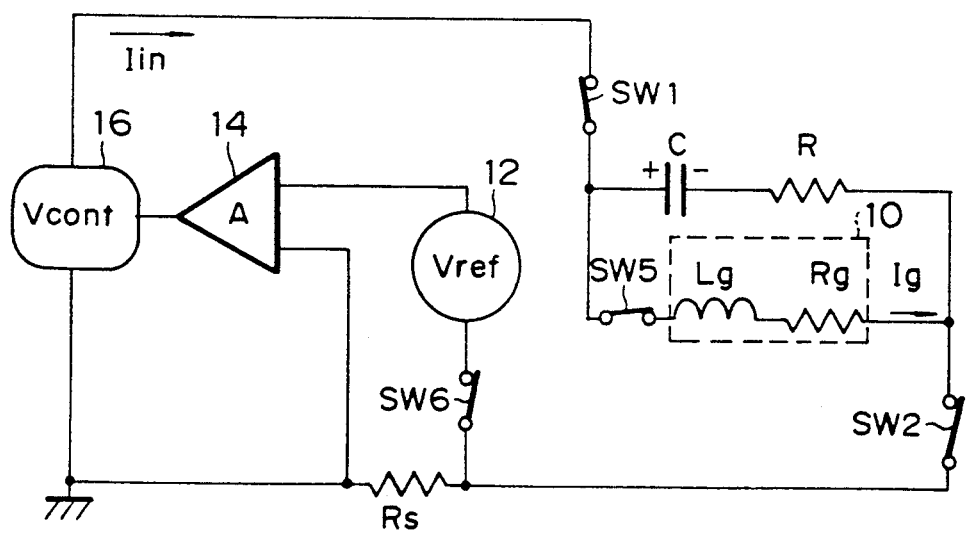
FIG. 17 illustrates a current flow in the embodiment of FIG. 7 at time t=t5 in the timing diagram of FIG. 9.

Subsequently, the capacitor C discharges and the gradient coil current Ig reverses. At t=t5, the electric charge on the capacitor C becomes minimum, and the resonance current Ig of the gradient coil 10 becomes maximum. As shown in FIG. 16, however, the resonance current Ig cannot reach Ip because of its decay due to loss in the snubber circuits and the resonance circuit. Suppose that the gradient coil current Ig at t=t5 is Ip'. At t=t5, the switching devices SW1 and SW2 are turned on with the switching device SW6 on, so that an overshoot voltage is generated from the power source 16 to thereby raise the gradient coil current Ig up to Ip. The connected state of the circuit and the current flow state at that point of time (t=t5) are illustrated in FIG. 17. At the same time the gradient coil current Ig reaches Ip, the resonance terminates, and the power source 16 generates a constant voltage to supply a constant current Ip until the next switching.

The magnitude of the overshoot voltage generated by the power source 16 is automatically regulated by the feedback circuit. A voltage drop is produced across the shunt resistor Rs by the power source current Iin, which is then compared with the reference voltage Vref. If the reference voltage Vref is set to Rs·Ip, then Rs(Ip−Ip') will be input to the differential amplifier 14, and a voltage Vcont proportional to Rs(Ip−Ip') will be generated as an overshoot voltage by the power source 16.

Neglecting a decay term, the gradient coil current Ig(t) at resonance (in the interval from t4 to t5) will be represented as follows:

$$Ig(t) = Ip \cdot \cos\omega_0(t - t4) \qquad (4)$$

$$\text{where } \omega_0: 1/(LgC)^{\frac{1}{2}} \qquad (5)$$

Lg: the inductance of the gradient coil
C: the capacitance of the capacitor

A voltage Vg(t) across the gradient coil 10 is represented as follows:

$$\begin{aligned} Vg(t) &= Lg(dIg/dt) \\ &= Ip(Lg/C)^{\frac{1}{2}}\sin\omega_0(t - t4) \end{aligned} \qquad (6)$$

Therefore, the capacitor C connected in parallel with the gradient coil 10 must have a withstand voltage higher than $Ip(Lg/C)^{\frac{1}{2}}$V. The current reversing time Tth in the resonance interval from t4 to t5 is represented as follows:

$$Tth = \pi(LgC)^{\frac{1}{2}} \qquad (7)$$

To protect the switching devices, the snubber circuits S may be connected in parallel with the switching devices SW1 to SW4, as shown in FIG. 7. In this case, assuming that the capacitors in the snubber circuits SW1 to SW4 have capacitance values Cp1 to Cp4, respectively, the total capacitance Cp1·Cp3/(Cp1+Cp3) of the series capacitances Cp1 and Cp3 and the total capacitance Cp2·Cp4/(Cp2+Cp4) of the series capacitances Cp2 and Cp4 will be connected in parallel with the capacitor C at the time of resonance (during the interval from t4 to t5). Thus, from equation (5) the C in equation (7) will be CT represented as follows:

$$CT = C + Cp1 \cdot Cp3(Cp1 + Cp3) + Cp2 \cdot Cp4/(Cp2 + Cp4) \quad (8)$$

With Cp1=Cp2=Cp3=Cp4=Cs in particular, equation (8) can be rewritten as follows:

$$CT = C + Cs \quad (9)$$

When the gradient coil current Ig reverses, power supplied from the power source 16 is consumed in resistive components of the resonance circuit such as the resistance Rg of the gradient coil 10, the resistance R connected to the capacitor C, etc. That is, although, as shown in FIG. 16, the gradient coil current Ig rises from $-Ip$ to $Ip'$ because of its dumped oscillation, power required to raise the current Ig from $Ip'$ to Ip is supplied from the power source 16. This power Wg (in joules) is represented as follows:

$$Wg = 0.5 Lg(Ip^2 - IP^2) \quad (10)$$

The above operation is repeated to terminate data acquisition by $t=t_{n-3}$. As shown in FIG. 9, during the interval from $t_{n-2}$ to $t_n$, a spoiler magnetic field is applied to cancel transverse magnetization components. The purpose of application of the spoiler is to prevent remaining transverse magnetization components from affecting the next MR imaging. To attain the same purpose, the time interval from $t_{n-3}$ to $t_{n-1}$ during which the gradient magnetic field is applied may be selected to be approximately half the time interval from t6 to t8, thereby causing transverse magnetization components to converge.

Figure 18:
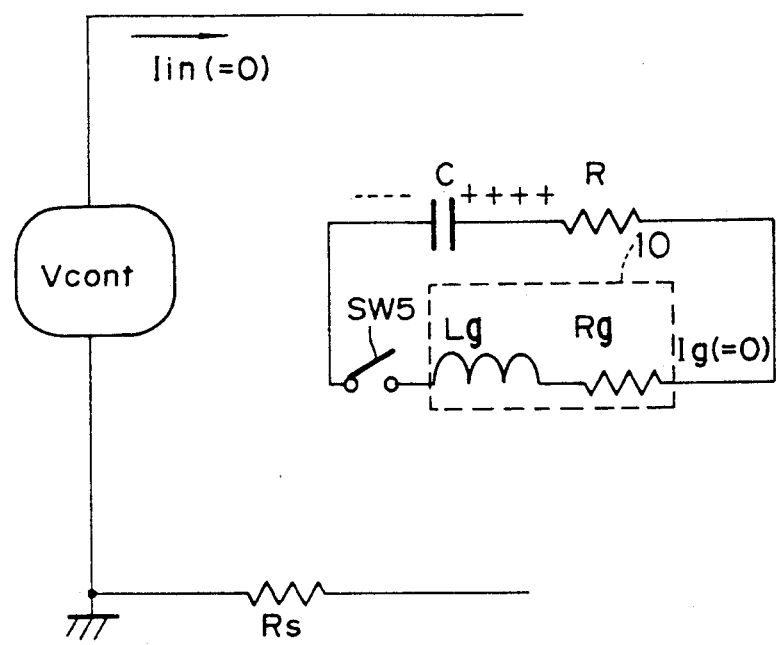
FIG. 18 illustrates a current flow in the embodiment of FIG. 7 at time t=tn in the timing diagram of FIG. 9.

Finally, the switching devices SW1, SW2, and SW6 are turned off at $t=t_{n-1}$ with the switching devices SW3 and SW4 off and then the switching device SW5 is turned off at $t=t_n$ at which the gradient coil current Ig decays to zero. This brings the resonance to an end, so that the current path to the gradient coil 10 is disconnected. At this point of time, a maximum electric charge is stored on the capacitor C. The circuit connected state and the current flow state at $t=t_n$ are illustrated in FIG. 18.

The next imaging sequence is initiated by turning the switching device SW5 on at an arbitrary time, for example, at $t=t1'$ to thereby resume the resonance which terminated at $t=t_n$. For this reason, the next imaging sequence can be started at any time. In addition, during the interval from $t_n$ to $t1'$, no current is supplied from the power source 16, and thus there is an advantage of dissipating no power.

Figure 2:
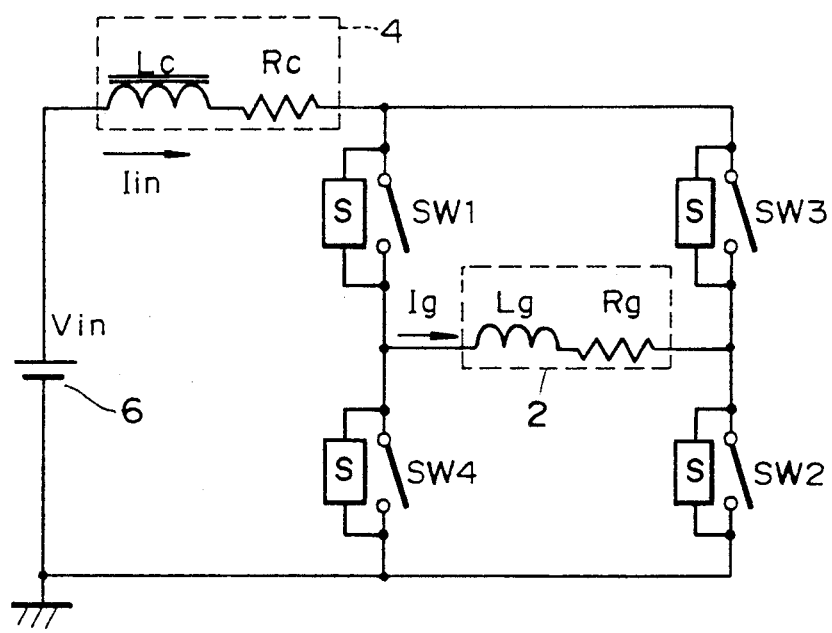
FIG. 2 is a schematic illustration of a conventional gradient power source apparatus used in an MRI system adapted for the echo-planar method.
Figure 3:
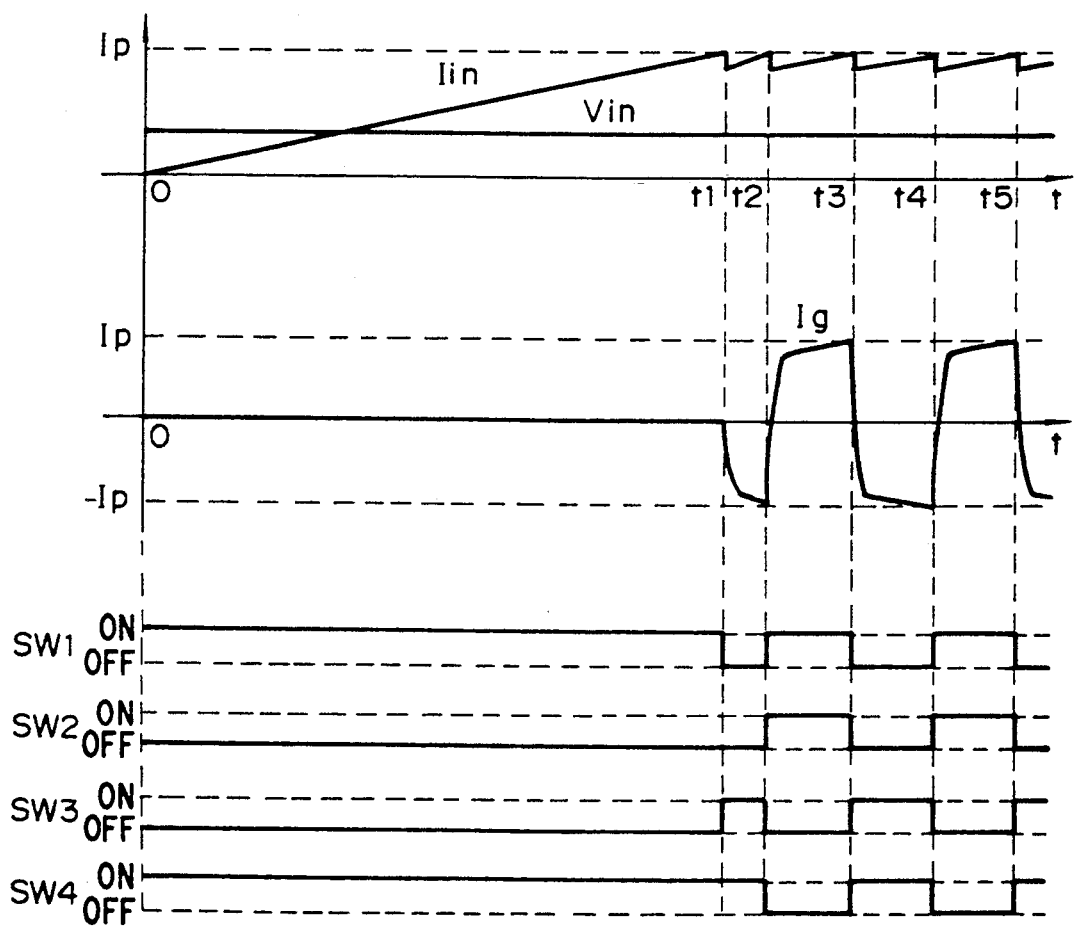
FIG. 3 is a timing diagram which is useful in understanding the operation of the apparatus of FIG. 2 for the echo-planar method.
Figure 4:
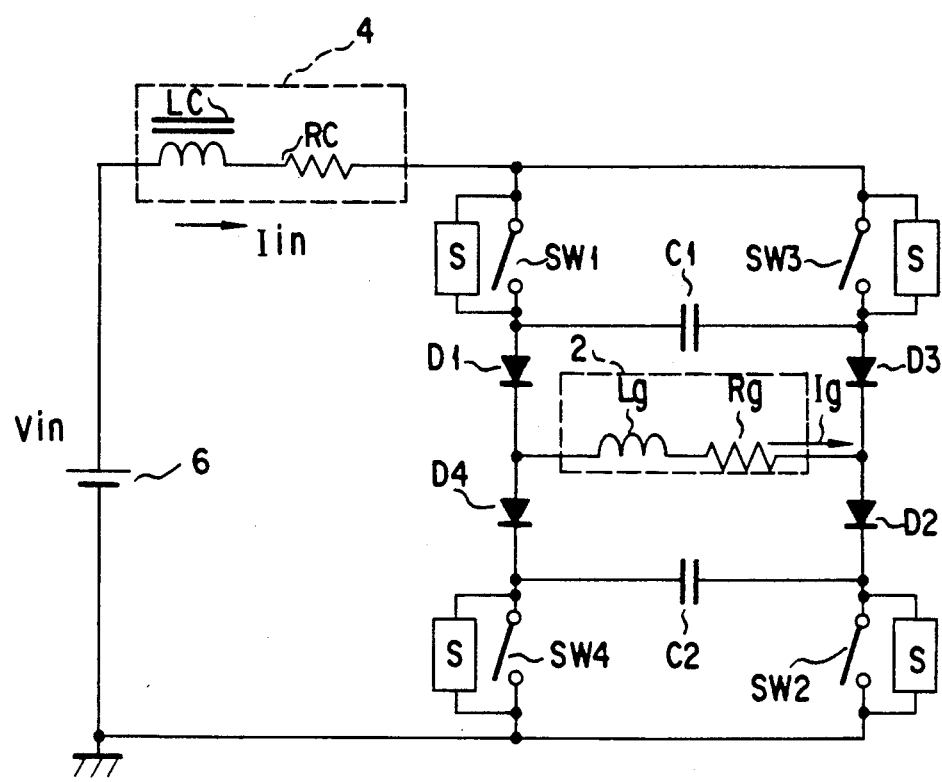
FIG. 4 is a schematic illustration of another conventional gradient power source apparatus used in an MRI system adapted for the echo-planar method.
Figure 5:
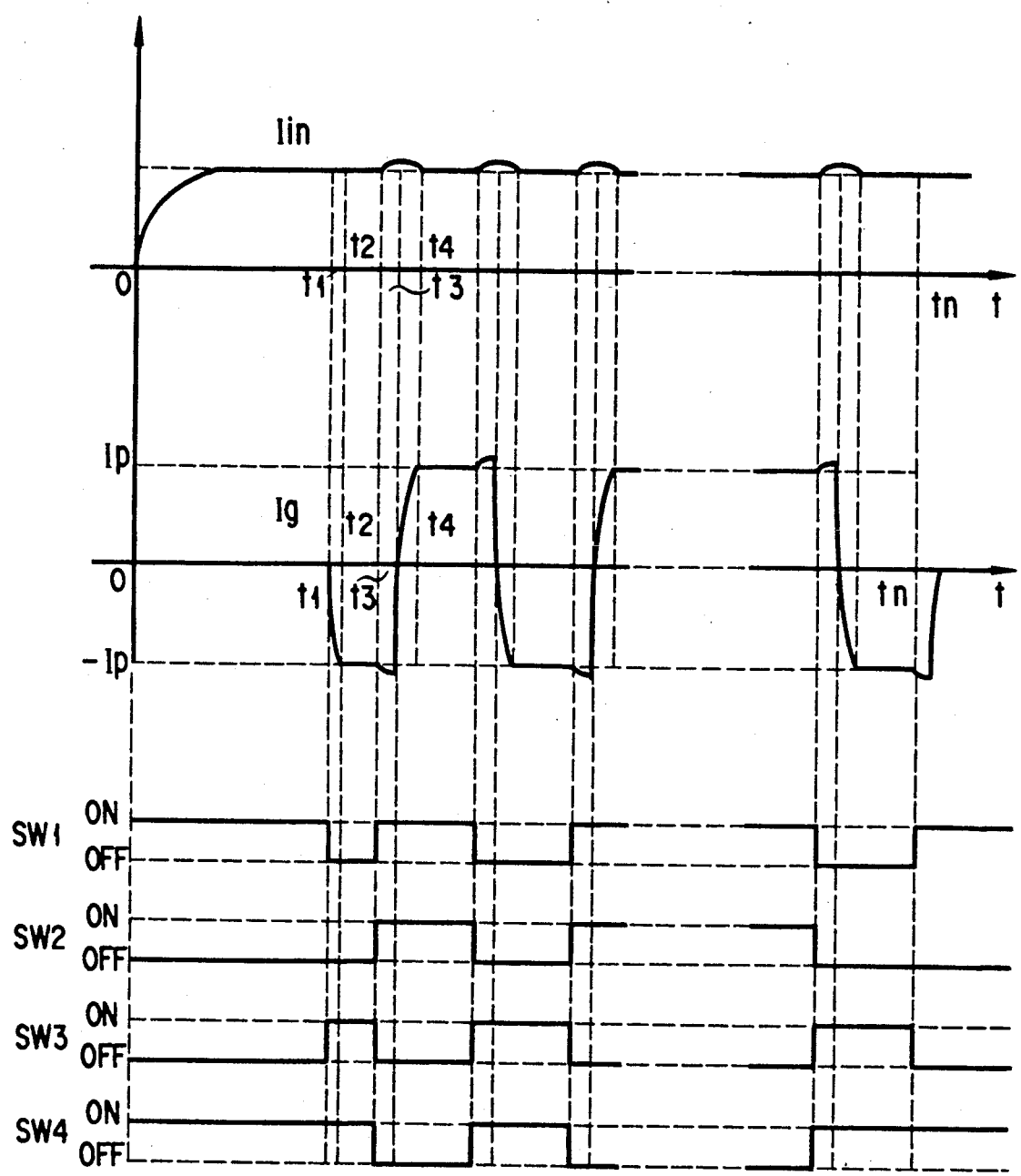
FIG. 5 is a timing diagram which is useful in understanding the operation of the apparatus of FIG. 4 for the echo-planar method.
Figure 6A:
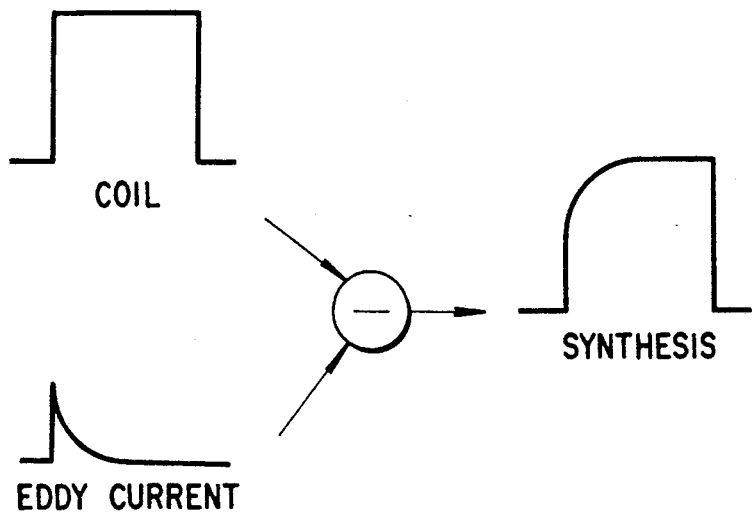
FIGS. 6A and 6B are diagrams for use in explanation of eddy current compensation.
Figure 6B:
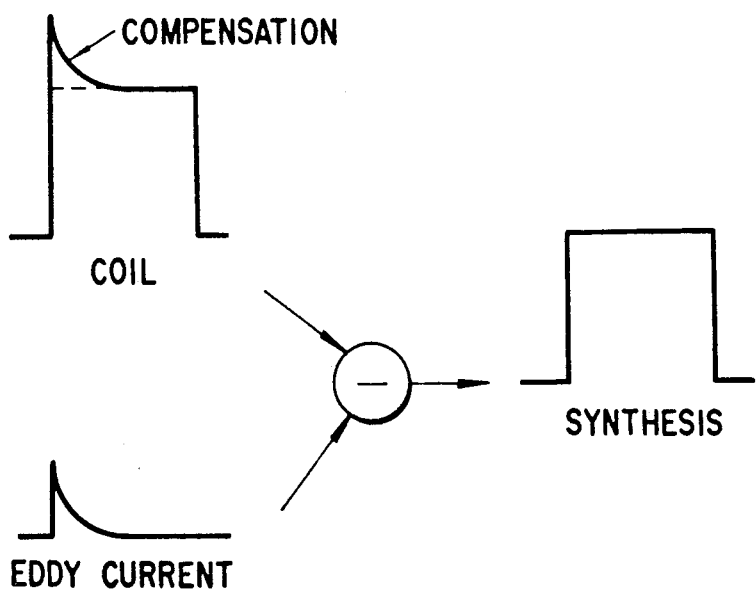

As described above, the first embodiment permits the gradient power source apparatus to be made compact without involving distortion of a gradient coil current waveform even if a large choke coil, as used in the prior art shown in FIG. 2 or FIG. 4, is not used.

Moreover, with the first embodiment, there is no need of storing magnetic energy in a choke coil or continuing to supply current all the time, and current has only to be supplied only when necessary. This will reduce power consumption further. With the first embodiment, since a choke coil can be removed, the interval which elapses from the time when the power is put to work to the time when a predetermined amount of current is reached is shortened, and the power consumption in that interval is reduced. In addition, the elimination of need of storing magnetic energy in a choke coil will accomplish an economy of power.

Furthermore, with the first embodiment, only the first imaging sequence needs a time interval (t=0 to t1) to store an electric charge on the capacitor C; however, subsequent imaging sequences can be begun at any time because the capacitor remains charged.

Figure 19:
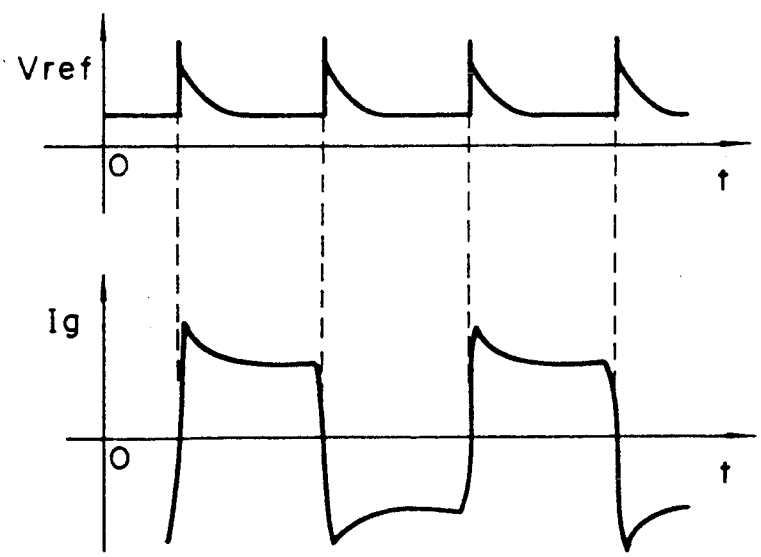
FIG. 19 illustrates a reference voltage waveform for eddy current compensation.

The first embodiment may be modified to superimpose a compensation current for eddy current compensation. As shown in FIG. 19, the superimposition of an eddy-current-compensation voltage waveform upon the reference voltage Vref allows the power source 16 to generate a higher overshoot voltage, thereby superimposing an eddy-current-compensation current upon the gradient coil current Ig.

Figure 20:
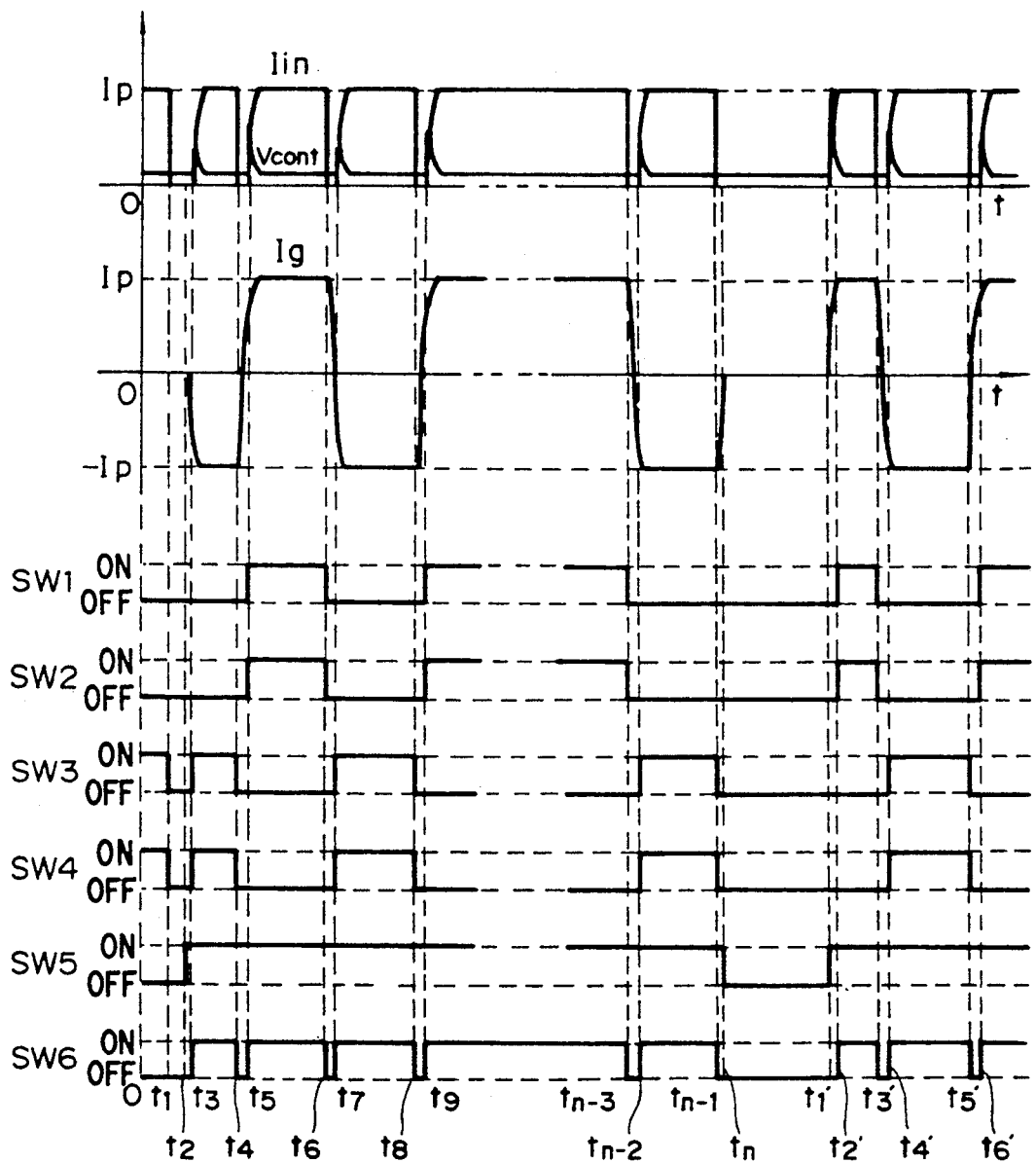
FIG. 20 is a timing diagram of the operation of a modification of the first embodiment of FIG. 7 in which a spoiler is not used.

It is also possible not to apply a spoiler during the interval from $t_{n-2}$ to $t_n$. In this case, as shown in FIG. 20, the polarity of the gradient coil current waveform for the second, fourth, and so forth imaging processes is opposite to that shown in FIG. 9. This problem can be solved by software to reconstruct an MRI image.

In the first embodiment, the power source is turned off at the time of resonance, but it needs not necessarily to be turned off.

The state shown in FIG. 18 lasts during the interval from $t_n$ to $t1'$ between imaging sequences, during which time some discharge of electric charge may occur from the capacitor C. To compensate for the discharge, the switching devices SW1 and SW2 may be turned on so as to charge the capacitor C.

Though having various features as described above, the first embodiment needs not necessarily to have all of the features simultaneously. The partial omission of the features at the expense of performance might make the apparatus easy to realize. Hereinafter, description will be made of other embodiments of the present invention in which some of the features of the first embodiment are omitted. In the following, the same reference characters are used to denote corresponding parts to those in the first embodiment and their detailed description is omitted.

Figure 21:
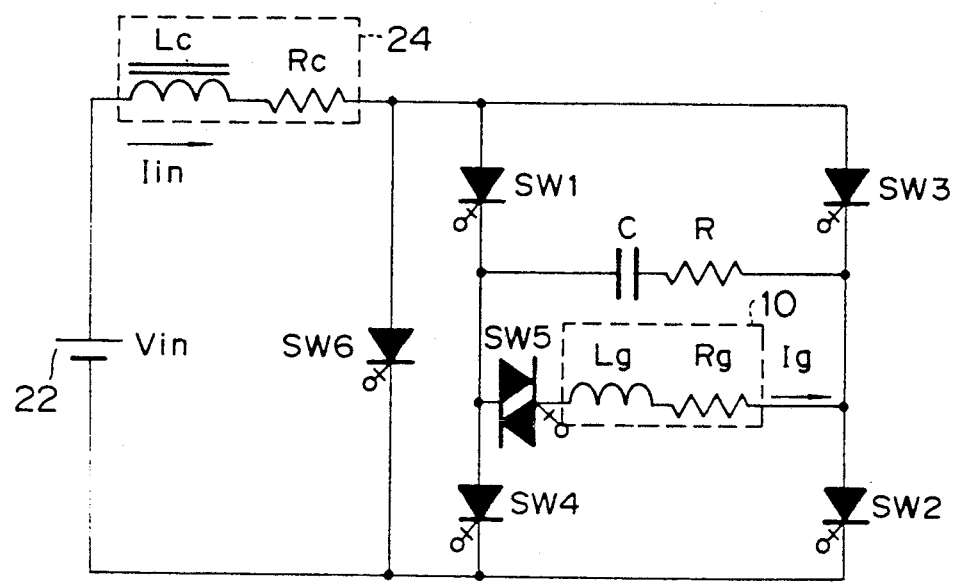
FIG. 21 is a schematic illustration of a gradient power source apparatus according to a second embodiment of the present invention.

Referring to FIG. 21, there is shown a second embodiment in which the current monitoring and feedback feature and the power-turning-off feature at the time of resonance are removed from the first embodiment. In this embodiment, a power source 22 for producing a constant voltage Vin is provided in place of the variable power source 16. A choke coil 24 that is low in inductance in compared with the conventional choke coil is connected between the power source 22 and the bridge circuit formed of the switching devices SW1 to SW4, and the switching device SW6 is connected in parallel with the power source 22. The snubber circuits are omitted from the drawing for simplicity.

Figure 22:
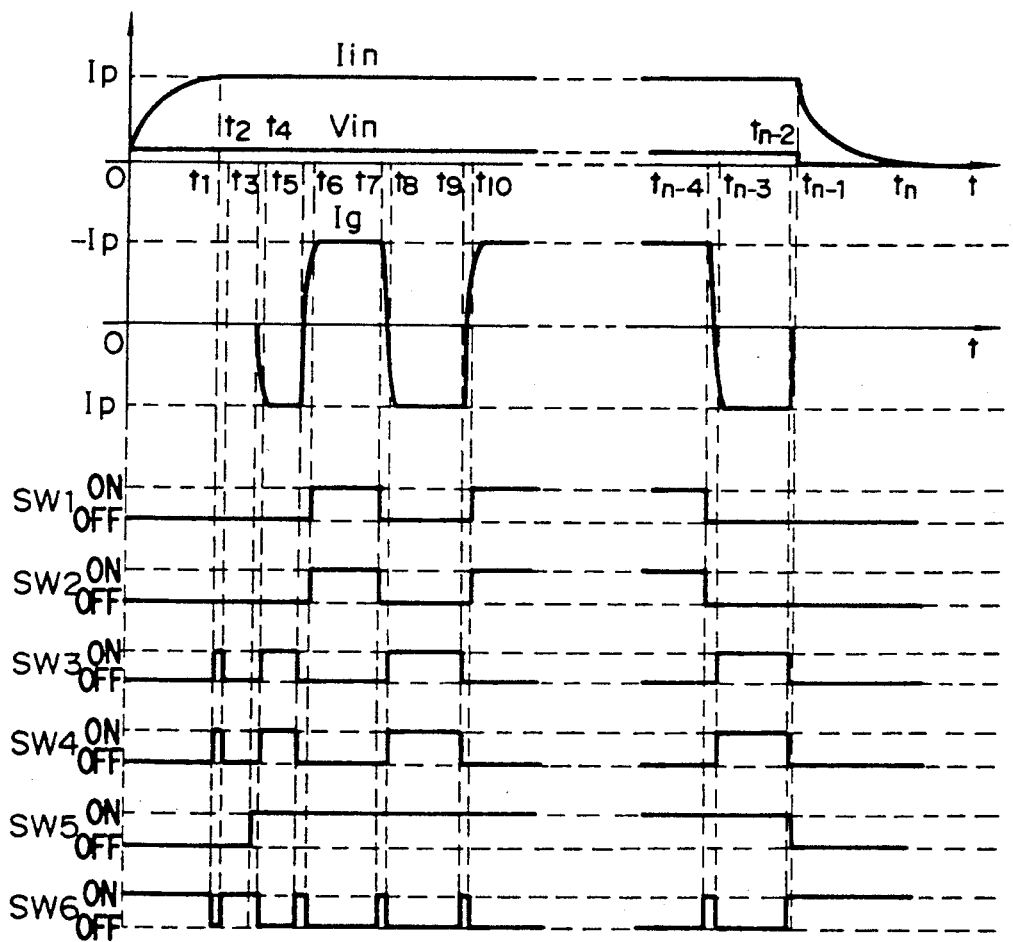
FIG. 22 is a timing diagram for use in explanation of the operation of the second embodiment of FIG. 21.

The operation of the second embodiment will be described with reference to FIG. 22, which is a timing diagram illustrating on/off times of the switching devices SW1 to SW6 and waveforms of a power source current Iin, a power source voltage Vin, and a gradient coil current Ig.

First, at t=0, the power source Vin is turned on, and only the switching device SW6 is turned on to thereby raise the power source current Iin. At t=t1 when the power source current Iin reaches a predetermined value Ip, the switching devices SW3 and SW4 are turned on, and the switching device SW6 is turned off to thereby store an electric charge on the capacitor C. At time t=t2 when the capacitor C is charged to a predetermined level, the switching devices SW3 and SW4 are turned off and the switching device SW6 is turned on. This state is kept until time t=t3 when an imaging sequence is initiated.

At t=t3, the switching device SW5 is turned on, so that the current Ig flows from the capacitor C to the gradient coil 10. At time t=t4 when the gradient coil current Ig reaches a peak value, the switching device SW6 is turned off, and the switching devices SW3 and SW4 are turned on with the result that the gradient coil 10 is supplied with a current from the power source 22.

In order to reverse the gradient coil current Ig at t=t5, the switching devices SW3 and SW4 are turned off, so that the capacitor C and the gradient coil 10 are brought into the resonance state. At the same time, the switching device SW6 is turned on to cease the current supply to the switching-device bridge circuit. At time t=t6 when the gradient coil current Ig reaches its peak value Ip because of the resonance of the capacitor C and the gradient coil 10, the switching device SW6 is turned off and the switching devices SW1 and SW2 are turned on to thereby connect the power source 22 and the bridge circuit. At this time, the current Ig flowing through the gradient coil 10 is lower than the desired current value Ip because of damped oscillation, but this is compensated for by a voltage that the choke coil 24 generates.

The imaging sequence terminates when the switching device SW6 is turned on and the switching devices SW3 and SW4 are turned off with SW1 and SW2 off at t=$t_{n-2}$. This places the gradient coil 10 and the capacitor C in the resonance state. At time t=$t_{n-1}$ when the gradient coil current Ig becomes 0, the switching device SW5 is turned off, bringing the resonance to an end. At the same time, the power source Vin is disconnected so that the power source current Iin becomes 0 at t=$t_n$.

With the second embodiment, the power source current is kept flowing between imaging sequences. Thus, the power consumption will be a little higher than in the first embodiment. In addition, some little time will be taken to raise the power source current because of the provision of the choke coil 24 though it is low in inductance. However, the second embodiment can achieve a much larger reduction of power consumption than the prior art shown in FIG. 2 or FIG. 4. Further, since the second embodiment, unlike the first embodiment, has no feedback circuit, it is simple in construction and easy to realize.

Figure 23:
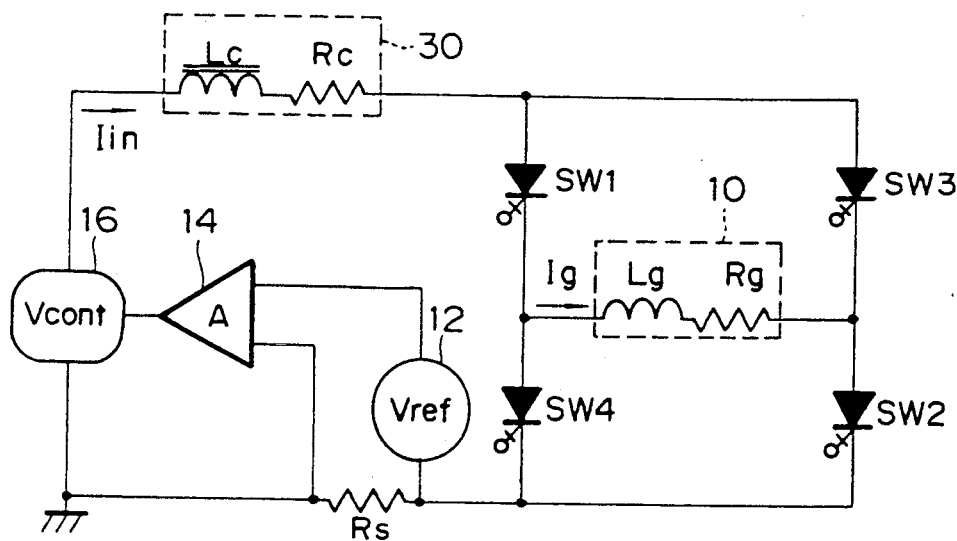
FIG. 23 is a schematic illustration of a gradient power source apparatus according to a third embodiment of the present invention.

A third embodiment of the present invention is illustrated in FIG. 23, in which the resonance circuit is removed from the first embodiment. In the third embodiment as well, a choke coil 30 is connected between the power source 16 and the bridge circuit formed of switching devices SW1 to SW4, but it has low inductance Lc. The snubber circuits are omitted from the drawing for simplicity as is the case with the second embodiment.

Like the first embodiment, the third embodiment is arranged to detect waveform distortion of the gradient coil current Ig using the resistor Rs and feed the result back to the power source Vcont to compensate for the coil current waveform distortion. The third embodiment is substantially the same as the prior art of FIG. 2 or FIG. 4 in power consumption but can shorten the rising time of the power source current Iin because of low inductance of the choke coil. Further, a peak value of the power source current Iin can be kept constant regardless of switching intervals.

Figure 24:
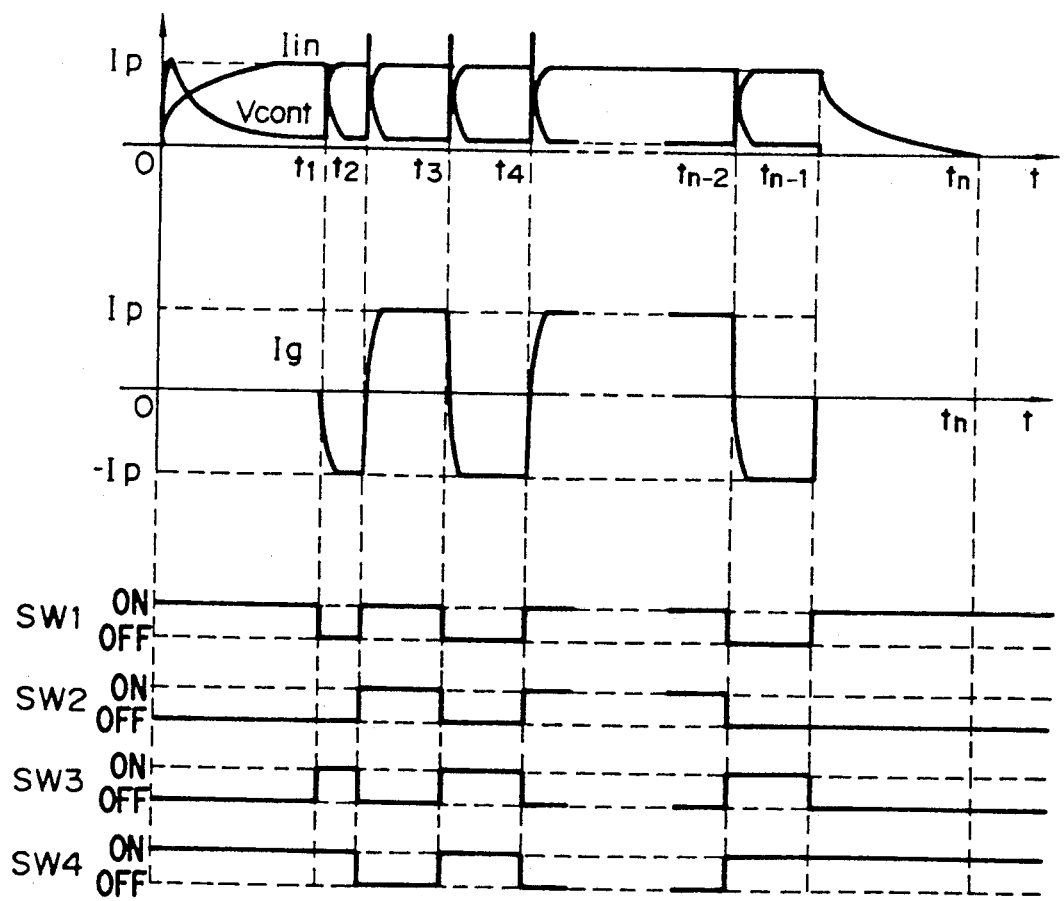
FIG. 24 is a timing diagram for use in explanation of the operation of the third embodiment of FIG. 22.

FIG. 24 is a timing diagram illustrating on/off times of the switching devices SW1 to SW6 and waveforms of the power source current Iin, the power source voltage Vcont and the gradient coil current Ig.

Figure 25:
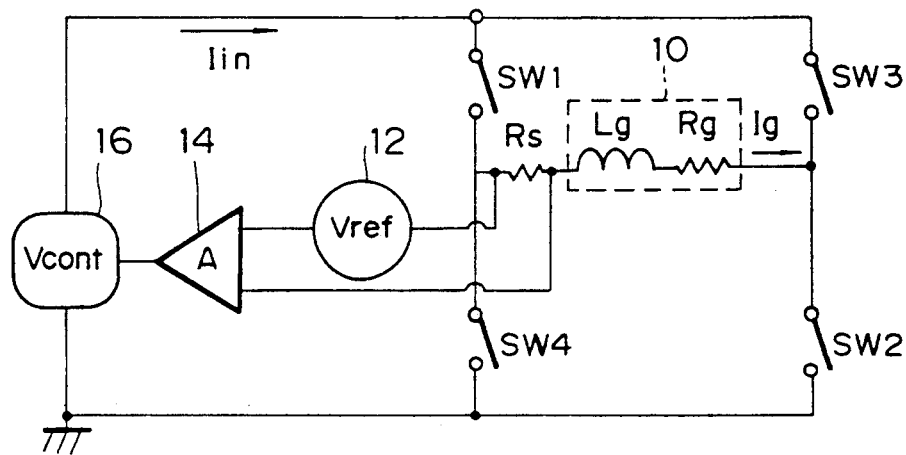
FIG. 25 is a schematic illustration of a gradient power source apparatus according to a fourth embodiment of the present invention.
Figure 26:
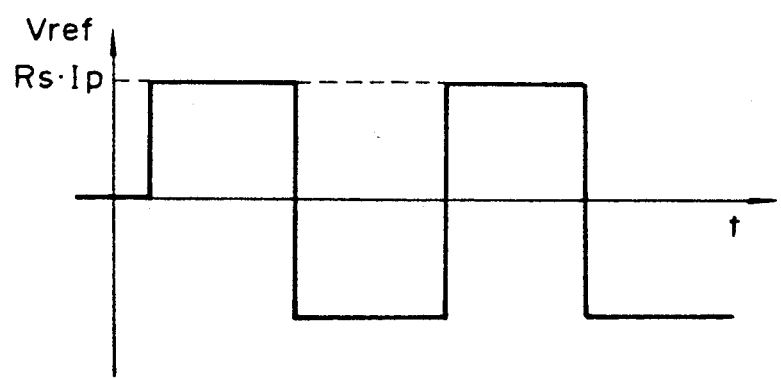
FIG. 26 illustrates a reference voltage waveform used in the fourth embodiment of FIG. 25.

FIG. 25 illustrates a fourth embodiment of the present invention. In the first and third embodiments, the power source current Iin is monitored for feedback to the power source 16. In the fourth embodiment, on the other hand, the resistor Rs is connected in series with the gradient coil 10 to monitor the gradient coil current Ig directly. If, in this embodiment, a rectangular current is caused to flow through the gradient coil 10, the reference voltage Vref will have a rectangular waveform whose peak value is Rs·Ip as shown in FIG. 26.

FIG. 27 illustrates a fifth embodiment of the present invention. The power source 16 used in the first and third embodiments is required to have a capability of generating a high current and a high voltage. Such a power source may be difficult to make. When such is the case, a power source 34 can be formed of two power sources; a power source 36 capable of generating a high current and a low voltage $V_L$ continuously, and a power source 38 capable of generating a high current and a high voltage $V_H$ momentarily. When the gradient coil current Ig is a constant current Ip, the power source 36 is used. The moment the coil current Ig is reversed, a switching device SW7 is changed over from the power source 36 to the power source 38, thereby applying the high voltage $V_H$. The switching device SW7 can be controlled automatically by a feedback circuit formed of the resistor Rs, the reference voltage source 12, and the differential amplifier 14.

FIG. 28 illustrates a sixth embodiment of the present invention which is an improvement over the fifth embodiment. This circuit is equipped with three types of power sources: a high-current low-voltage power source $V_L$ (on the order of 500 A and 20 V) for producing a constant current Iin, a medium-current medium-voltage power source $V_M$ (on the order of 5 A and 500 V) for supplying energy reduced by loss in the circuit, and a low-current high-voltage power source $V_H$ (on the order of 100 mA and 5 kV) adapted for initial charging of the capacitor C. These power sources are switched by external control or automatically. In FIG. 28, the gradient coil resistance Rg is omitted for simplicity.

The sixth embodiment is somewhat different from the first embodiment in places where a bridge circuit which is formed of the switching devices SW1 to SW5 and diodes D1 to D5 and the capacitor C forming the resonance circuit with the gradient coil Lg are connected.

The operation of the sixth embodiment will be described using a timing diagram of FIG. 19 and circuit diagrams of FIGS. 30 to 34.

First, at time t=0, only the switching device SW6 is turned on so that the power sources $V_H$, $V_M$, and $V_L$ are put to work. As a result, the capacitor C is charged by the power source $V_H$. The circuit connected state and the current flow state at this point of time is illustrated in FIG. 30.

Next, at time t=t1 when data acquisition is started, the switching device SW6 is turned off and the switching devices SW3, SW4, and SW5 are turned on, so that a current flows from the capacitor C to the gradient coil Lg. The circuit connected state and the current flow state at t=t1 are illustrated in FIG. 31.

At time t=t2 when the gradient coil current Ig reaches a desired value −Ip and the charge on the capacitor C reduces to a minimum, a transistor TR2 automatically turns off and the switching device SW5 also turns off. Then, the power source $V_L$ will supply the constant current Iin to the gradient coil Lg, during which time the power source $V_M$ charges the capacitor C to supply energy that reduced by loss in the circuit when the gradient coil current reverses. The circuit connected state and the current flow state at t=t2 are illustrated in FIG. 32.

In this way, the gradient coil current Ig is raised.

Next, in order to reverse the gradient coil current Ig at time t=t3, the switching devices SW1, SW2, and SW5 are turned on, while the switching devices SW3 and SW4 are turned off. Then, the gradient coil Lg and the capacitor C enters the resonance state in which the gradient coil current flows into the capacitor C through the diodes D1, D2, and D5, thereby charging the capacitor. The circuit connected state and the current flow state at this point of time is illustrated in FIG. 33.

Immediately after the gradient coil current Ig becomes 0 and the charge on the capacitor C becomes maximum, the capacitor discharges to supply a reversed current to the gradient coil Lg through the transistors TR1 and TR2 and the switching devices SW1 and SW2. The circuit connected state and the current flow state at this point of time are illustrated in FIG. 34.

At time t=t4, the gradient coil current Ig reaches a desired value Ip and consequently the transistor TR2 turns off automatically to turn the switching device SW5 off. As a result, the circuit is switched again such that the power source $V_L$ supplies the constant current to the gradient coil Lg.

The reason why the transistor TR2 turns off automatically at a time when the gradient coil current reaches the desired value Ip is based on a principle called class-G operation. That is, when a current flowing through the transistors TR1 and TR2 is lower than Ip, the drain-to-source voltage of the transistor TR1 is lower than a gate voltage VG of the transistor TR2, and thus the gate-to-source voltage of the transistor TR2 is positive, so that the transistor TR2 is on. However, when the current flowing through the transistor TR1 reaches Ip, the drain-to-source voltage of the transistor TR1 becomes equal to the gate voltage VG of the transistor TR2 and thus the gate-to-source voltage of the transistor TR2 becomes 0, so that the transistor TR2 is rendered off.

The features of the sixth embodiment are that the variable-voltage source Vcont in the first embodiment can easily be constructed from the three constant-voltage DC power sources $V_H$, $V_M$, and $V_L$, and the switching from $V_M$ to $V_L$ can be made automatically.

FIG. 35 illustrates a seventh embodiment of the present invention. In the first and third embodiments, a feedback control method was used to control the supply voltage Vcont. Where the magnitude and waveform of a compensation voltage are known beforehand, there is no need of provision of a feedback circuit, and programmed control of the supply voltage Vcont by a controller 40 may be used as shown in FIG. 35. Though not shown in FIG. 35, at least one of the resonance circuit and the choke coil must be provided to regulate the waveform of the gradient coil current.

FIG. 36 illustrates an eighth embodiment of the present invention, in which a high voltage output when the gradient coil current Ig reverses is applied to the coil 10 through a transformer 44. The transformer 42 has a primary winding connected with the constant-voltage power source Vin and a secondary winding connected to receive an output of the differential amplifier 14. The output voltage of the transformer 44 is controlled by the output of the differential amplifier 14. According to this embodiment, the supply voltage Vcont can be realized using the simplest arrangement.

According to the present invention, as described above, a gradient power source apparatus can be provided which can remove a choke coil or make its inductance low and thus can reduce the waiting time from when the power source is put to work to the time when an imaging sequence is started and power consumed during that time. The use of energy of the resonance circuit when the coil current reverses can decrease power consumption further. Monitoring a coil current waveform for feedback control of the power source can prevent waveform distortion.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the second to eighth embodiments may also be modified similarly to the first embodiment. That is, with the second to eights embodiments as well, it is possible to make an eddy current compensation or not to apply a spoiler.

What is claimed is:

1. A gradient power source apparatus for use with gradient coil means used in magnetic resonance imaging apparatus to cause said gradient coil means to produce a gradient magnetic field, comprising:
   capacitor means, connected in parallel with said gradient coil means, for forming a resonance circuit with said gradient coil means;
   switching devices connected together to form a bridge circuit which is connected between a power supply terminal and said gradient coil means, said bridge circuit having two nodes, said capacitor means and said gradient coil means connected between the same two nodes of said bridge circuit; and
   control means for controlling said switching devices to thereby control a current supplied to said gradient coil means, said control means including means for bringing said resonance circuit to resonance to thereby reverse a current flowing through said gradient coil means.

2. The apparatus according to claim 1, wherein said control means includes means for disconnecting said gradient coil means from said power supply terminal at a time of resonance of said resonance circuit.

3. The apparatus according to claim 1, wherein said control means includes means for detecting a current flowing through said gradient coil means and means, responsive to a result of detection by said detecting means, to regulate a peak value of the current flowing through said gradient coil means.

4. The apparatus according to claim 1, further comprising a choke coil connected in series with said power supply means.

5. The apparatus according to claim 1, wherein said control means disconnects said resonance circuit from said power supply terminal at resonance.

6. The apparatus according to claim 1, wherein said control means comprises:
   detecting means for detecting a current flowing through said gradient coil means;
   means for causing a current corresponding to a result of detection by said detecting means to flow through said gradient coil means; and
   means for superimposing a compensation current for compensating for distortion of a magnetic field due to eddy current in said gradient coil means upon said current caused to flow through said gradient coil means.

7. A gradient magnetic field generating apparatus for use in a magnetic resonance imaging apparatus, comprising:
   variable-output power source means having a terminal;
   coil means for generating a gradient magnetic field when supplied with a current from said power source means;
   capacitor means, connected in parallel with said coil means, for forming a resonance circuit with said coil means
   switching devices, connected between said resonance circuit and said power source means to form a bridge circuit which is connected between the terminal of said variable-output power source means and said coil means, said bridge circuit having two nodes, said capacitor means and said coil means connected between the same two nodes of said bridge circuit, for controlling charging/discharging of said capacitor means and a current flowing through said coil means including its direction, said switching devices charging an electric charge of a first polarity in said capacitor means bringing said resonance circuit to resonance to thereby cause a discharging current of said capacitor means to flow through said coil means in a first direction, causing a current from said power source means to flow through said coil means in said first direction following said discharging current from said capacitor means, charging an electric charge of a second polarity in said capacitor means, bringing said resonance circuit to resonance to thereby cause a discharging current of said capacitor means to flow through said capacitor means in a second direction, and causing a current from said power source means to flow through said coil means in said second direction, thereby causing said coil means to generate a rectangular gradient magnetic field; and
   control means for detecting a current flowing through said coil means and varying an output of said power source means so that a detected current equals a predetermined value.

8. The apparatus according to claim 7, wherein said switching devices comprise a first switching device connected in series with said coil means and in parallel with said capacitor means, a second switching device connected between a first end of said capacitor means and a first terminal of said power source means, a third switching device connected between a second end of said capacitor means and said first terminal of said power source means, a fourth switching device connected between said first end of said capacitor means and a second terminal of said power source means, and a fifth switching device connected between said second end of said capacitor means and said second terminal of said power source means.

9. The apparatus according to claim 7, wherein each of said switching devices comprises one of a power transistor, a metal-oxide-semiconductor field effect transistor, an insulated gate bipolar transistor, a static induction transistor, and a gate turnoff device.

10. The apparatus according to claim 7, further comprising a snubber circuit connected in parallel with each of said switching devices, said snubber circuit comprising a first resistor connected in parallel with a corresponding one of said switching devices, a series combination of a diode and a capacitor which is connected in parallel with said first resistor, and a second resistor connected in parallel with said diode.

11. The apparatus according to claim 7, wherein said control means detects a current flowing through said coil means on the basis of an output of a current detector connected in series with said power source means.

12. The apparatus according to claim 7, wherein said control means detects a current flowing through said coil means on the basis of an output of a current detector connected in series with said coil means.

13. The apparatus according to claim 7, wherein said power source means comprises a single power source for outputting a variable current.

14. The apparatus according to claim 7, wherein said power source means comprises a first power source for generating a high current and a low voltage continuously, a second power source for generating a high current and a high voltage momentarily, and selecting means for connecting said second power source to said coil means at a time of reversing a current flowing through said coil means and connecting said first power source to said coil means at other times.

15. The apparatus according to claim 7, wherein said power source means comprises a first power source for generating a high current and a low voltage, a second power source for generating a medium current and a medium voltage, and a third power source for generating a low current and a high voltage, and wherein said switching devices charges an electric charge of said first polarity in said capacitor means with said third power source, brings said resonance circuit to resonance to cause a discharging current of said capacitor means to flow through said coil means in said first direction, supplies a current from said first power source to said coil means in said first direction and charges an electric charge of said first polarity in said capacitor means with said second power source when an electric charge in said capacitor means is minimum, brings said resonance circuit to resonance to thereby supply a discharging current from said capacitor means to said coil means in said second direction, and supplies a current from said first power source to said coil means in said second direction and charges an electric charge of said first polarity in said capacitor means with said second power source when an electric charge in said capacitor means is minimum.

16. The apparatus according to claim 7, wherein said switching devices disconnect said power source means from said resonance circuit when said resonance circuit is at resonance.

17. The apparatus according to claim 7, wherein said switching devices are subjected to on/off control in accordance with a pulse sequence for the echo-planar method and disconnect said power source means from said resonance circuit on termination of each pulse sequence.

18. The apparatus according to claim 7, in which said power source means comprises a constant-voltage power source and a transformer having a primary winding connected with said constant-voltage power source and a secondary winding connected to receive an output signal of said control means.

* * * * *